(12) United States Patent
Titus et al.

(10) Patent No.: US 9,595,519 B2
(45) Date of Patent: Mar. 14, 2017

(54) COMBINATION METAL OXIDE SEMI-CONDUCTOR FIELD EFFECT TRANSISTOR (MOSFET) AND JUNCTION FIELD EFFECT TRANSISTOR (JFET) OPERABLE FOR MODULATING CURRENT VOLTAGE RESPONSE OR MITIGATING ELECTROMAGNETIC OR RADIATION INTERFERENCE EFFECTS BY ALTERING CURRENT FLOW THROUGH THE MOSFETS SEMI-CONDUCTIVE CHANNEL REGION (SCR)

(71) Applicant: The United States of America as represented by the Secretary of the Navy, Washington, DE (US)

(72) Inventors: Jeffrey L. Titus, Bloomington, IN (US); Mark Savage, Bloomington, IN (US); Patrick L. Cole, Bedford, IN (US); Adam R. Duncan, Bloomington, IN (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 231 days.

(21) Appl. No.: 14/668,081

(22) Filed: Mar. 25, 2015

(65) Prior Publication Data
US 2016/0276339 A1    Sep. 22, 2016

Related U.S. Application Data

(60) Provisional application No. 62/135,299, filed on Mar. 19, 2015.

(51) Int. Cl.
*H02H 7/00* (2006.01)
*H01L 27/07* (2006.01)

(52) U.S. Cl.
CPC .............................. *H01L 27/0705* (2013.01)

(58) Field of Classification Search
CPC .................................................. H01L 27/0705
(Continued)

(56) References Cited

U.S. PATENT DOCUMENTS 7,843,004 B2 * 11/2010 Darwish ............... H01L 29/407
257/329
8,803,206 B1 * 8/2014 Or-Bach ............. H01L 25/0657
257/278

(Continued)

Primary Examiner — Stephen W Jackson
(74) Attorney, Agent, or Firm — Christopher A. Monsey

(57) ABSTRACT

Systems and methods for controlling current or mitigating electromagnetic or radiation interference effects using a combination of a metal-oxide semiconductor field effect transistor (MOSFET) and junction field effect transistor (JFET) disposed perpendicularly and within a certain orientation to each other. An embodiment of the invention can be formed and operable for modulating current and/or voltage response or mitigating electromagnetic or radiation interference effects on the MOSFET by controlling a semiconductive channel region (SCR) using an additional gate, e.g., JFET, disposed perpendicularly with respect to the MOSFET configured to generate an electromagnetic field into the MOSFET's semi-SCR. A control system for controlling operation is also provided to include automated systems including sensors as well as manually operated systems. Automated systems can include radiation sensors as well as other control systems such as radio frequency transmitter or receiver systems. Methods of operation for a variety of modes are also provided.

72 Claims, 36 Drawing Sheets

(58) Field of Classification Search
USPC .......................................................... 361/56
See application file for complete search history.

(56) References Cited

U.S. PATENT DOCUMENTS

| | | | | |
|---|---|---|---|---|
| 9,165,972 | B2* | 10/2015 | Suess | ................ H01L 27/14643 |
| 9,214,572 | B2* | 12/2015 | Banerjee | ................. H01L 21/22 |
| 2015/0295571 | A1 | 10/2015 | Cole et al. | |

* cited by examiner

N-Channel BGMOSFET, Figs 7, 9, 11
P-Channel BGMOSFET, Figs 8, 10, 12

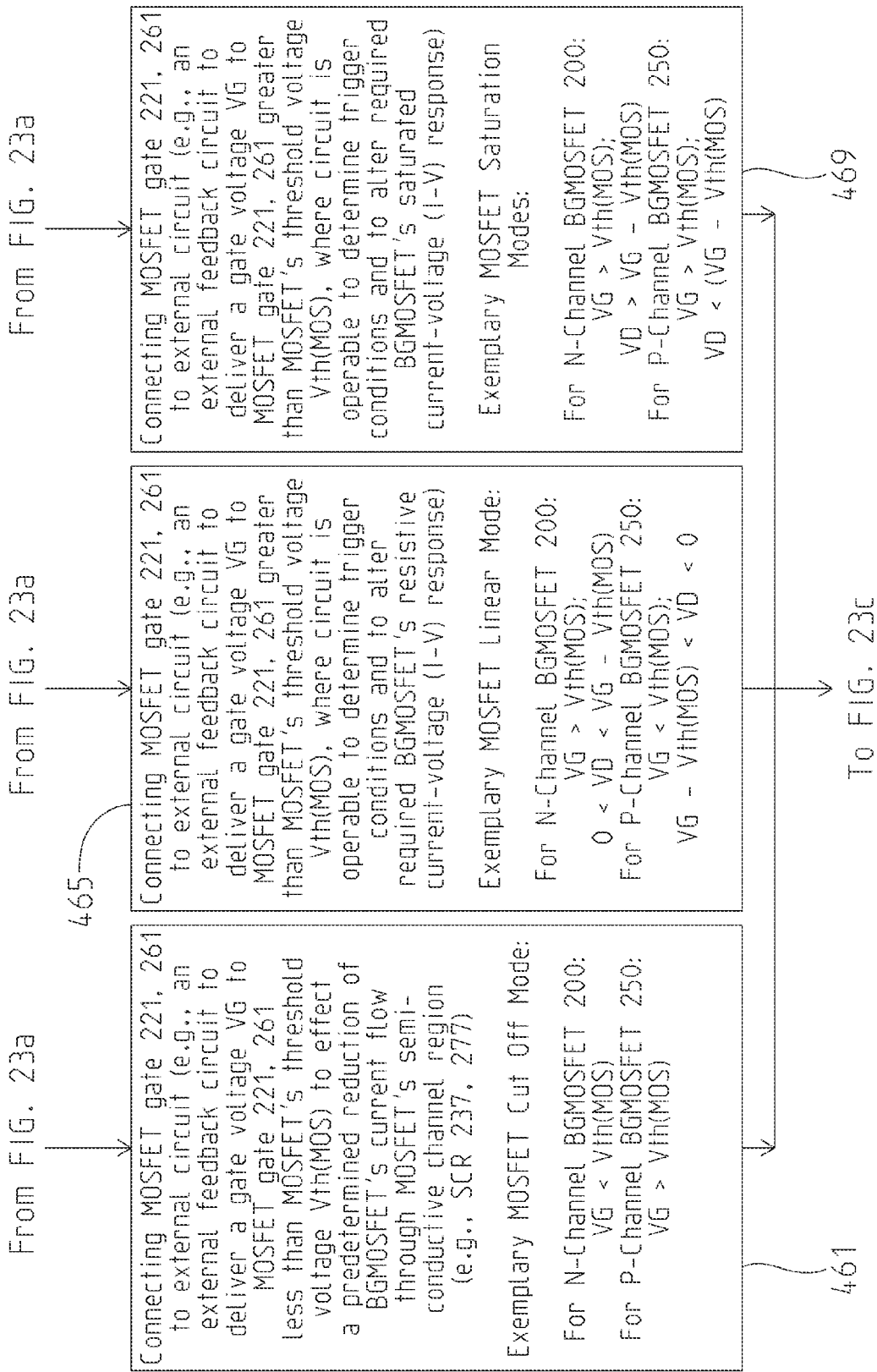

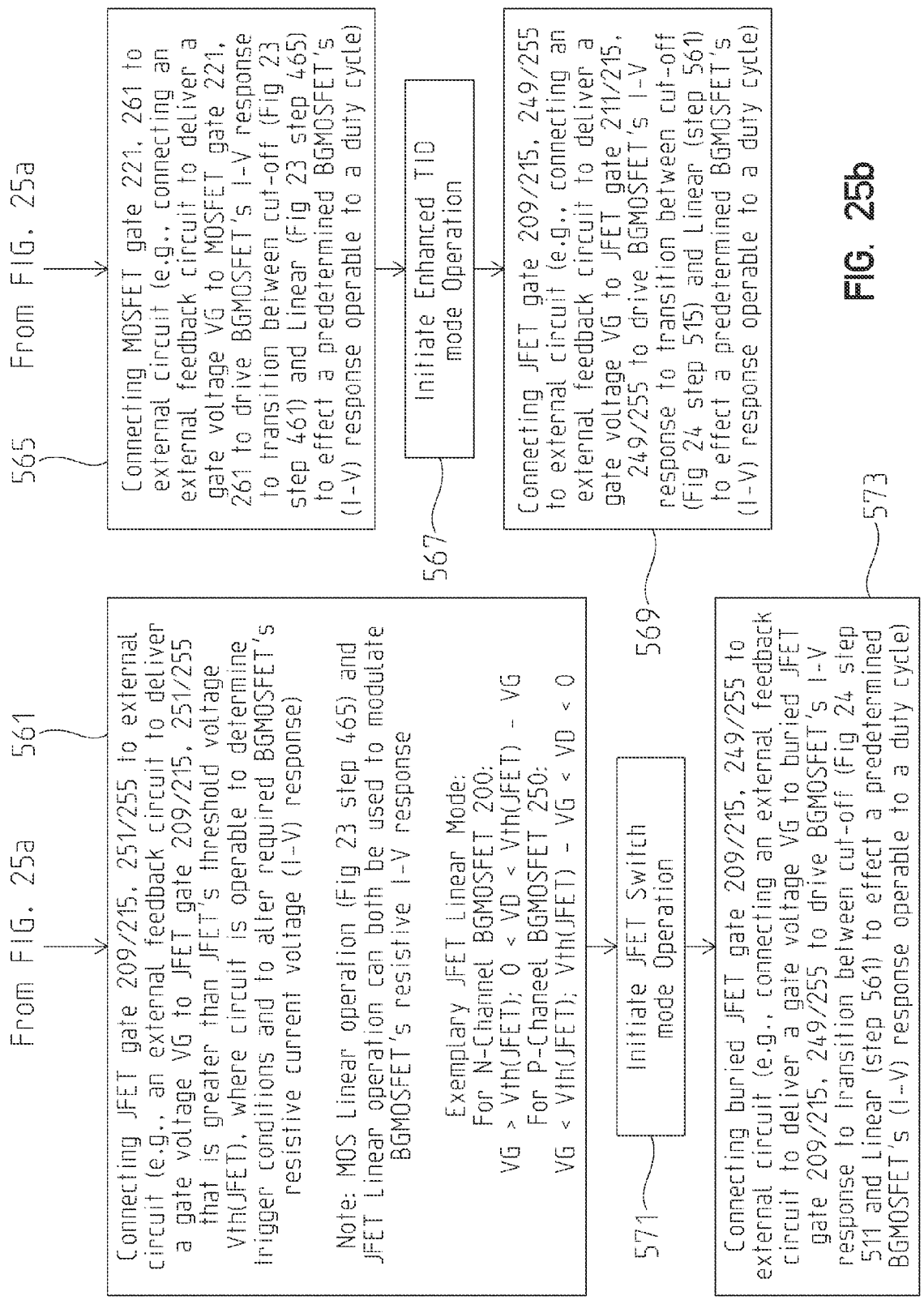

COMBINATION METAL OXIDE SEMI-CONDUCTOR FIELD EFFECT TRANSISTOR (MOSFET) AND JUNCTION FIELD EFFECT TRANSISTOR (JFET) OPERABLE FOR MODULATING CURRENT VOLTAGE RESPONSE OR MITIGATING ELECTROMAGNETIC OR RADIATION INTERFERENCE EFFECTS BY ALTERING CURRENT FLOW THROUGH THE MOSFETS SEMI-CONDUCTIVE CHANNEL REGION (SCR)

CROSS-REFERENCE TO RELATED APPLICATIONS

The present application claims priority to U.S. Provisional Patent Application Ser. No. 62/135,299, filed Mar. 19, 2015, entitled "BURIED GATE METAL-OXIDE SEMICONDUCTOR FIELD EFFECT TRANSISTOR," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,114) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

Metal-Oxide-Semiconductor Field-Effect Transistors (MOSFETs) are used because of their fast switching, low power capabilities. FIG. 1 represents a simplistic vertical cross-sectional view of an N-channel MOSFET 1 design/layout where the structure is sliced parallel to a source and drain along the length of a channel (for reference, see FIG. 2, orientation of cutline AB used in FIG. 1). FIG. 3 represents a simplistic vertical cross-sectional view of a P-channel MOSFET 3 design/layout where the structure is sliced parallel to a source and drain along the length of a channel (for reference, see FIG. 4, orientation of cutline AB used in FIG. 3). An exemplary N-channel MOSFET 1 as shown in FIG. 1 uses a P-type substrate 115; whereas, an exemplary P-channel MOSFET 3 as shown in FIG. 3 uses an N-type substrate 135. A conductive layer contacting bottom of substrate forms a substrate contact 117 (for N-channel) or substrate contact 137 (for P-channel). At top of exemplary substrate 117 or 137, a region of opposite doping 105, 107 (for N-channel) and 125, 127 (for P-channel) is implanted/diffused to form a doped region (hereinafter referred to as body) (e.g., N-channel devices use N-type body 105, 107 and P-channel devices use N-type body 125, 127). To ensure contact to body regions, a higher doped region can be implanted/diffused into the exemplary body (not shown). Once doped regions are formed (e.g., P-type bodies 105, 107 or N-type bodies 125, 127), a conductive layer can be deposited to make drain contact 101 or 121 and source contact 103 or 123 forming a portion of an electrical conductive path (shown as dashed line through these areas) for an electrical power supply (not shown). A dielectric material (e.g., a gate oxide 109 or 129) can be placed on top of substrate region (e.g., P-type substrate 115 or N-type substrate 135) and over/between body regions (e.g., N-type body regions 105, 107 or P-type body regions 125, 127). Referring to FIG. 1, a MOSFET gate contact 111 is formed by placing a conductive layer on top of gate oxide 109. A region separated between N-type body regions 105, 107 but underneath gate oxide 109 defines a semi-conductive channel region (SCR) 113. Referring to FIG. 3, a MOSFET gate contact 131 is formed by placing a conductive layer on top of gate oxide 129. A region separated between P-type body regions 125, 127 and underneath gate oxide 129 defines a semi-conductive channel region (SCR) 133. Dashed arrow lines represent an electrical conductive path that is formed during operation of FIGS. 1 and 3 MOSFETs.

Numerous modifications/improvements in the design, layout, and fabrication of metal-oxide-semiconductor field-effect transistors (MOSFETs) have been made to enhance electrical and radiation performance (e.g., lower power, faster switching, enhanced radiation hardness, etc.). Numerous radiation issues have been discovered and significant research has been devoted to resolve specific radiation issues (e.g., total ionizing dose (TID)).

Under normal MOSFET operation, application of an appropriate gate voltage (a gate voltage greater than MOSFET's gate threshold voltage) forms a conducting path between source and drain (forming a channel region along a surface) allowing current to flow (MOSFET is turned on). Higher gate voltage above threshold voltage equates to higher current flow. An effect of TID is to trap charge within a gate oxide, which in turn induces a shift in MOSFET gate threshold voltage (e.g., gate threshold voltage changes with TID). If this TID-induced threshold voltage shift becomes sufficiently large, a MOSFET becomes non-functional (e.g., N-channel MOSFET cannot be turned off while P-channel MOSFET cannot be turned on without exceeding its electrical specification). Methods exist to help resolve TID issues exhibited by MOSFETs. One method is to decrease the thickness of a MOSFET's gate oxide (thinner gate oxide trap less charge) but a thinner gate oxide makes a MOSFET more susceptible to SEGR and increases gate capacitance. Another method entails controlling quality of the gate dielectric material where higher quality equates to higher costs and lot-to-lot variability. Another method is to exceed the gate voltage specification that drive the MOSFET (gate voltage to turn-on or turn-off a MOSFET) but the gate threshold voltage can shift beyond safe operating voltages.

FIG. 5 represents a cross-sectional view of a simplistic design/layout of an exemplary P-channel Junction-Field-Effect Transistor (JFET) 5 with the JFET structure cut perpendicular to drain contact 141 and source contact 143 along the JFET gates 149, 151. FIG. 6 represents a cross-sectional view of a simplistic design/layout of an exemplary N-channel JFET 7 with the JFET structure cut perpendicular to drain contact 161 and source contact 163 along the JFET gates 169, 171. A JFET uses a reverse-biased P-N junction to control current flow by modulating the depletion field lines 155 or 175 within the semi-conductive channel region (SCR) 157 or 177 (a higher reverse voltage applied to PN junction extends electrical field lines further outward restricting current flow in SCR 177). P-Channel JFET uses a P-Type Substrate 153 and N-Channel JFET uses an N-Type Substrate 173. A conductive layer can be deposited onto opposite ends of substrate forming a drain contact 141 (for P-channel) or 161 (for N-channel) and a source contact 143 (for P-channel) or 163 (for N-channel). Toward a middle of 153 (for P-channel) or 173 (for N-channel), a region is implanted/diffused with opposite doping of substrate (P-Channel uses a N-type Body 145, 147; whereas, N-Channel uses P-Type Body 165, 167) forming a PN junction between body and substrate regions. A conductive layer is deposited onto these opposite doped regions to form JFET gate contacts 149, 151 (for P-channel) or 169, 171 (for N-channel).

Unlike a MOSFET, a JFET exhibits a natural TID radiation hardness. TID effects in a MOSFET are caused by radiation-induced trapped charge in gate oxide interfering with modulation of semi-conductive channel region; whereas, a JFET does not employ a dielectric material to modulate semi-conductive channel region eliminating the effect of radiation-induced trapped charge.

Current applications involving radio-frequency (RF) applications such as RF mixers, RF amplifiers, RF gain control, and RF detectors may employ two individual transistors (e.g., MOSFETs) to perform an intended function. If an electrical circuit uses two transistors to accomplish an intended function, there are added costs and weight and requires more space when compared to a single transistor option. FIG. 7 provides a simple circuit design using a dual gate transistor and the same design using two transistors to demonstrate how a dual gate transistor can be used in an actual circuit design. A dual gate transistor can be used in many other RF type applications. Presently, dual-gate MOSFETs can be built by packaging two MOSFETs into a hybrid-type package where the two MOSFETs are placed in series but this implementation does not address radiation effects and increases overall cost, weight and size. Another implementation is to place two MOSFETs in series using a monolithic type layout. Again, this implementation does not address radiation effects.

Embodiments of the invention provide improvements to address various disadvantages associated with current MOSFETs and provide desired improvements. Generally an embodiment of the invention includes a combination MOSFET and JFET operable for modulating current/voltage response or mitigating electromagnetic or radiation interference effects by altering current flow through the MOSFET's semi-conductive channel region (SCR). For example, one embodiment of the invention, such as an exemplary Buried-Gate Metal-Oxide-Semiconductor Field Effect Transistor (BGMOSFET), can include a layout/design of an innovative structure integrating/combining aspects of a MOSFET and a JFET, which allows a drain-to-source current to be controlled by a MOSFET gate as well as be controlled by a buried JFET gate. The exemplary BGMOSFET can be fabricated as a monolithic device (merging functions of a MOSFET with a MOSFET gate and functions of a JFET with a buried JFET gate into a monolithic structure). One embodiment's basic fabrication steps (design/layout) of an exemplary BGMOSFET can include implanting/diffusing a buried gate in conjunction with elements of manufacturing of a MOSFET gate. Exemplary embodiments of the invention, e.g., BGMOSFET, can also enhance operational performance in a TID radiation environment. Existing MOSFETs can be prone to TID-induced threshold voltage (Vth) shifts from ionizing radiation environments that can lead to functional failure. An exemplary embodiment's independent buried JFET Gate can provide a radiation-hardened-by-design (RHBD) approach if MOSFET gate functionally fails from TID effects by using buried JFET gate to control current flow beyond operational failure point of MOSFET gate (e.g., an exemplary improved buried JFET gate allows the exemplary structure to control current in the semi-conductive channel region even after the MOSFET gate becomes non-functional from TID-induced threshold voltage shifts). Additionally, an exemplary BGMOSFET can be useful in RF type applications such as mixers, gain control, amplifiers, and detectors because the exemplary device employs a second independent gate to control current flow in the semi-conductive channel region.

Additional features and advantages of the present invention will become apparent to those skilled in the art upon consideration of the following detailed description of the illustrative embodiment(s) exemplifying some best modes of carrying out the invention as presently perceived.

BRIEF DESCRIPTION OF THE DRAWINGS

The detailed description of the drawings particularly refers to the accompanying figures in which:

FIGS. 23A-23C show an exemplary method of operation of an exemplary embodiment of the invention comprising another mode of operation;

FIGS. 25A and 25B show an exemplary method of operation of an exemplary embodiment of the invention comprising another mode of operation;

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
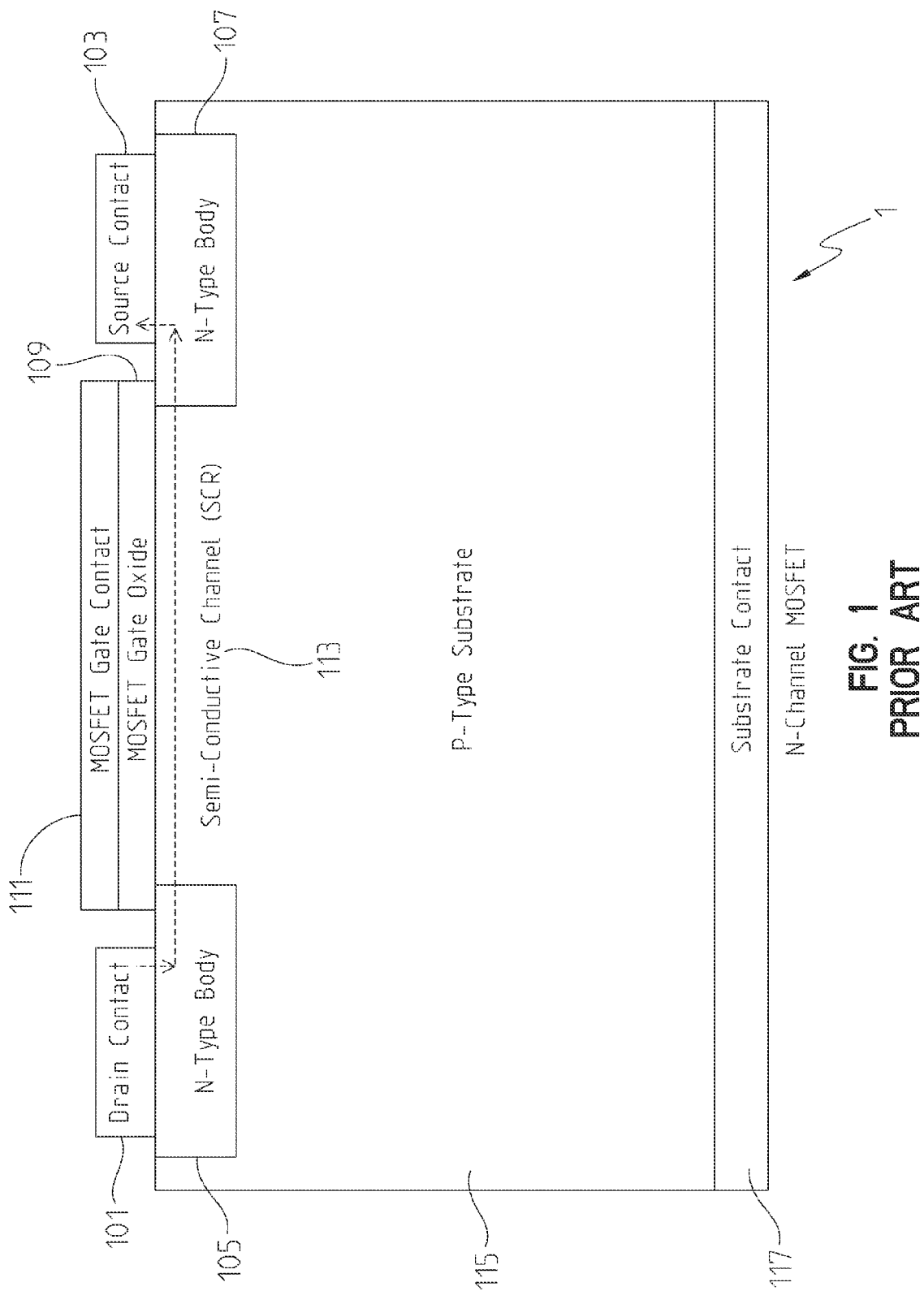
FIG. 1 shows a simplified cross-sectional view of a N-channel MOSFET.
Figure 2:
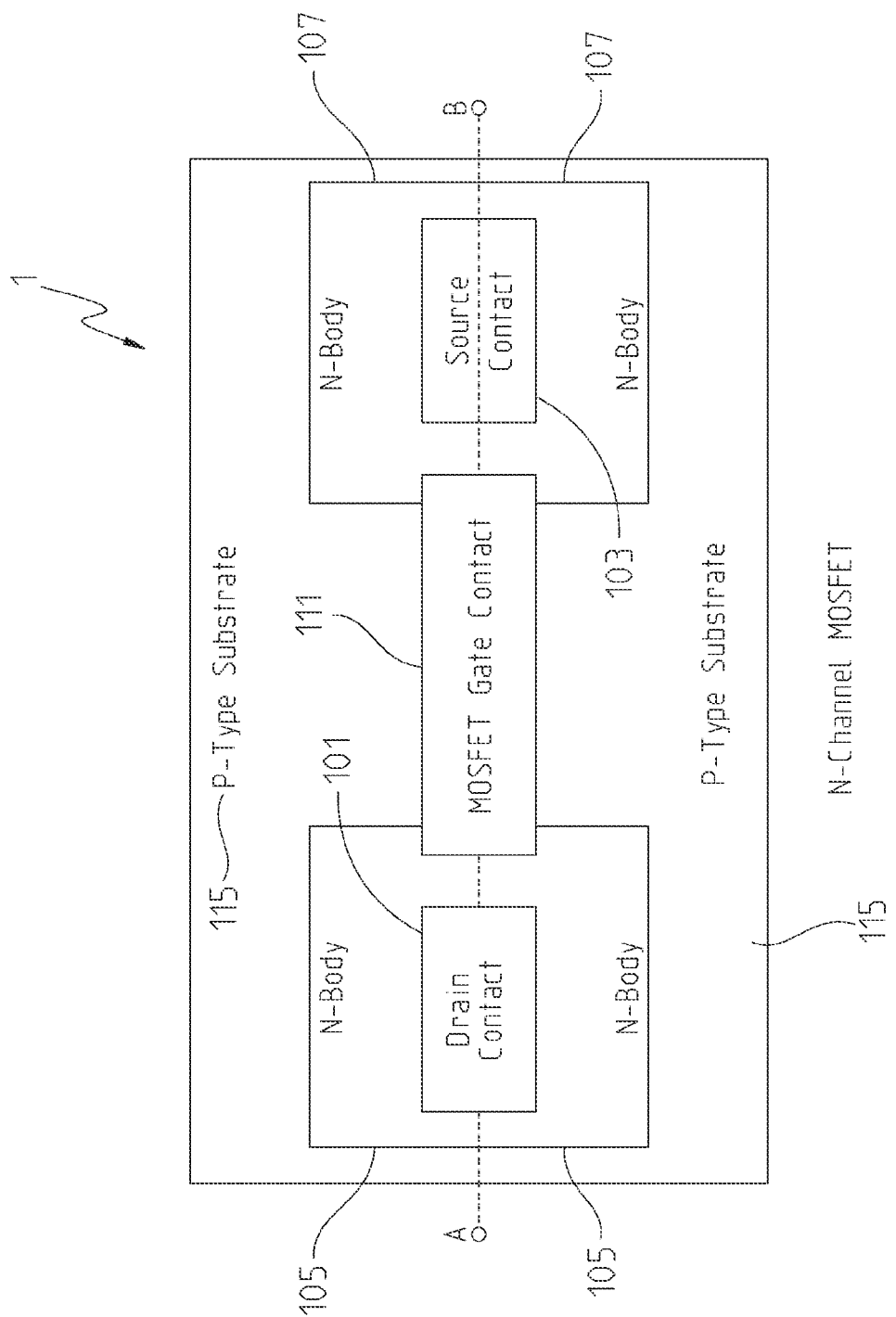
FIG. 2 shows a simplified top view of a N-channel MOSFET.
Figure 3:
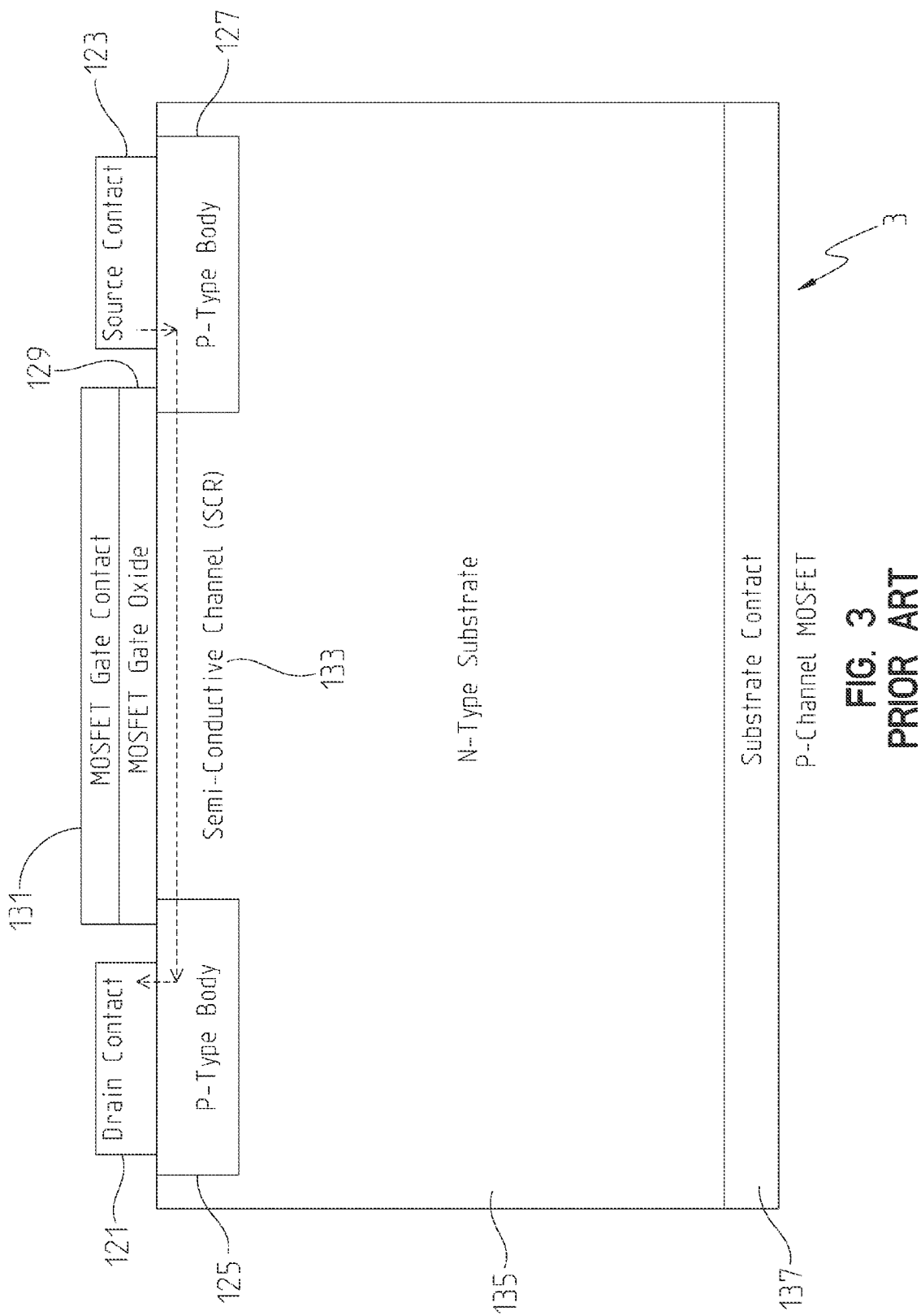
FIG. 3 shows a simplified cross-sectional view of a P-channel MOSFET.
Figure 4:
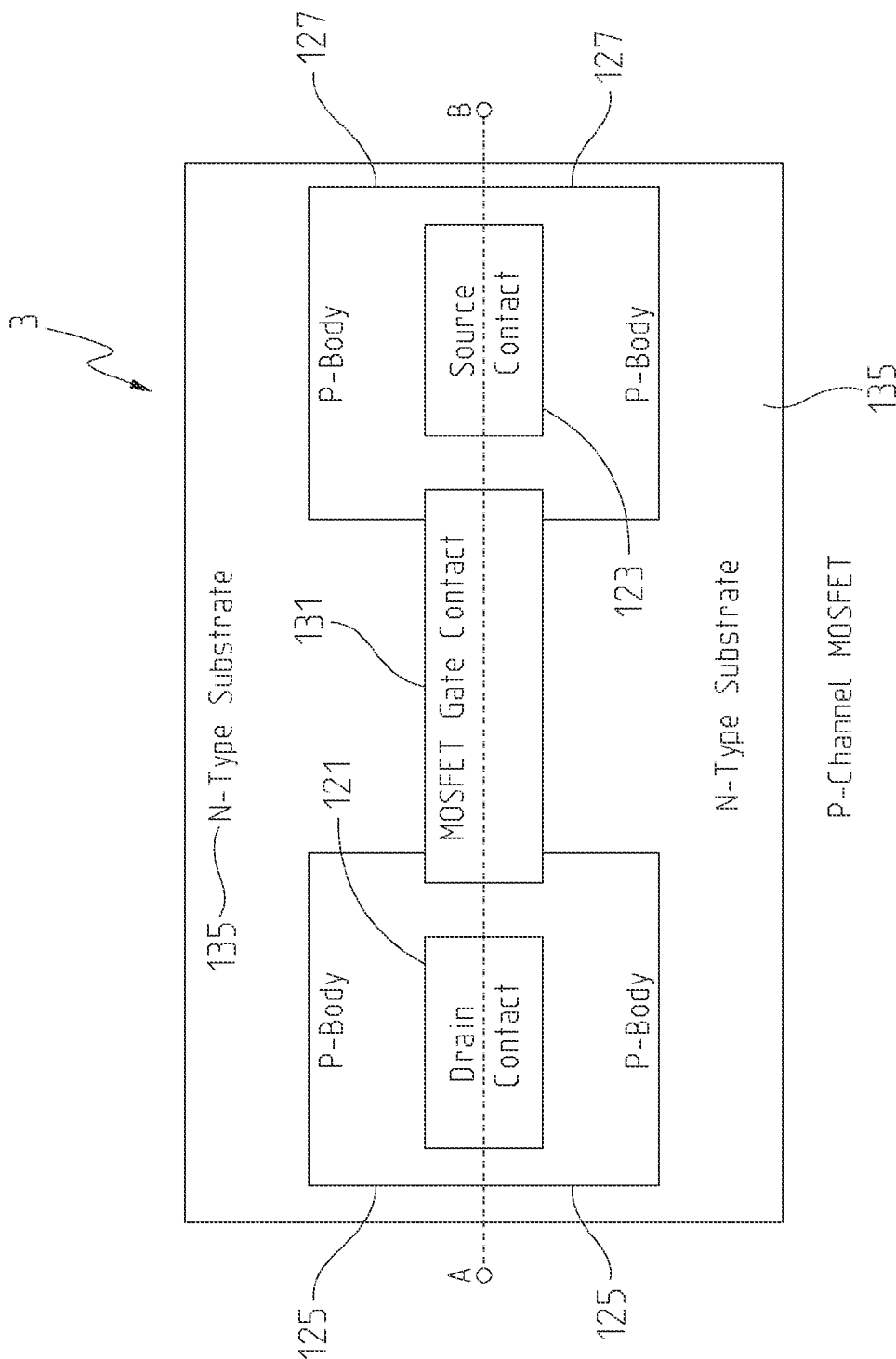
FIG. 4 shows a simplified top view of a P-channel MOSFET.
Figure 5:
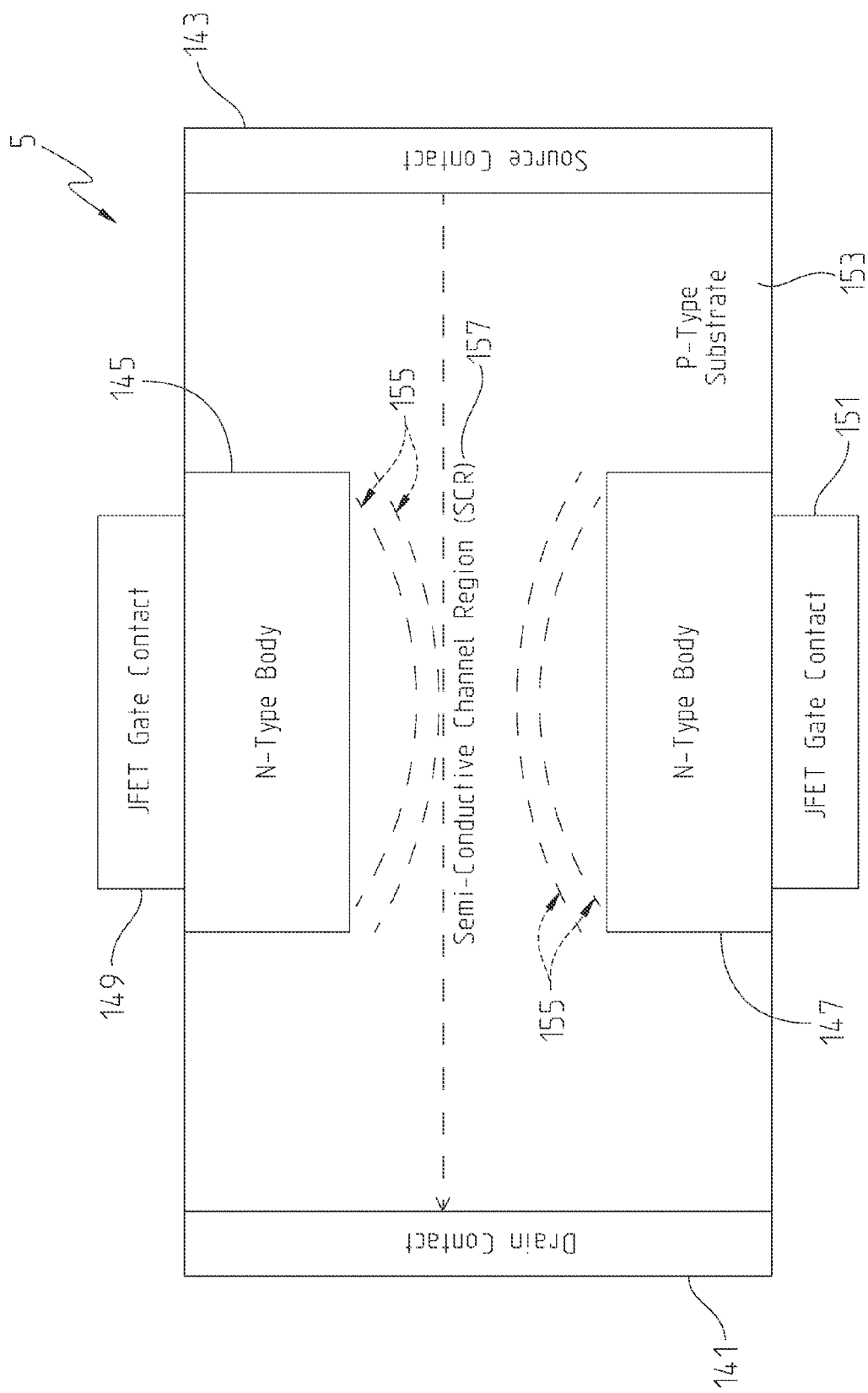
FIG. 5 shows a simplified cross-sectional view of a N-channel JFET.
Figure 6:
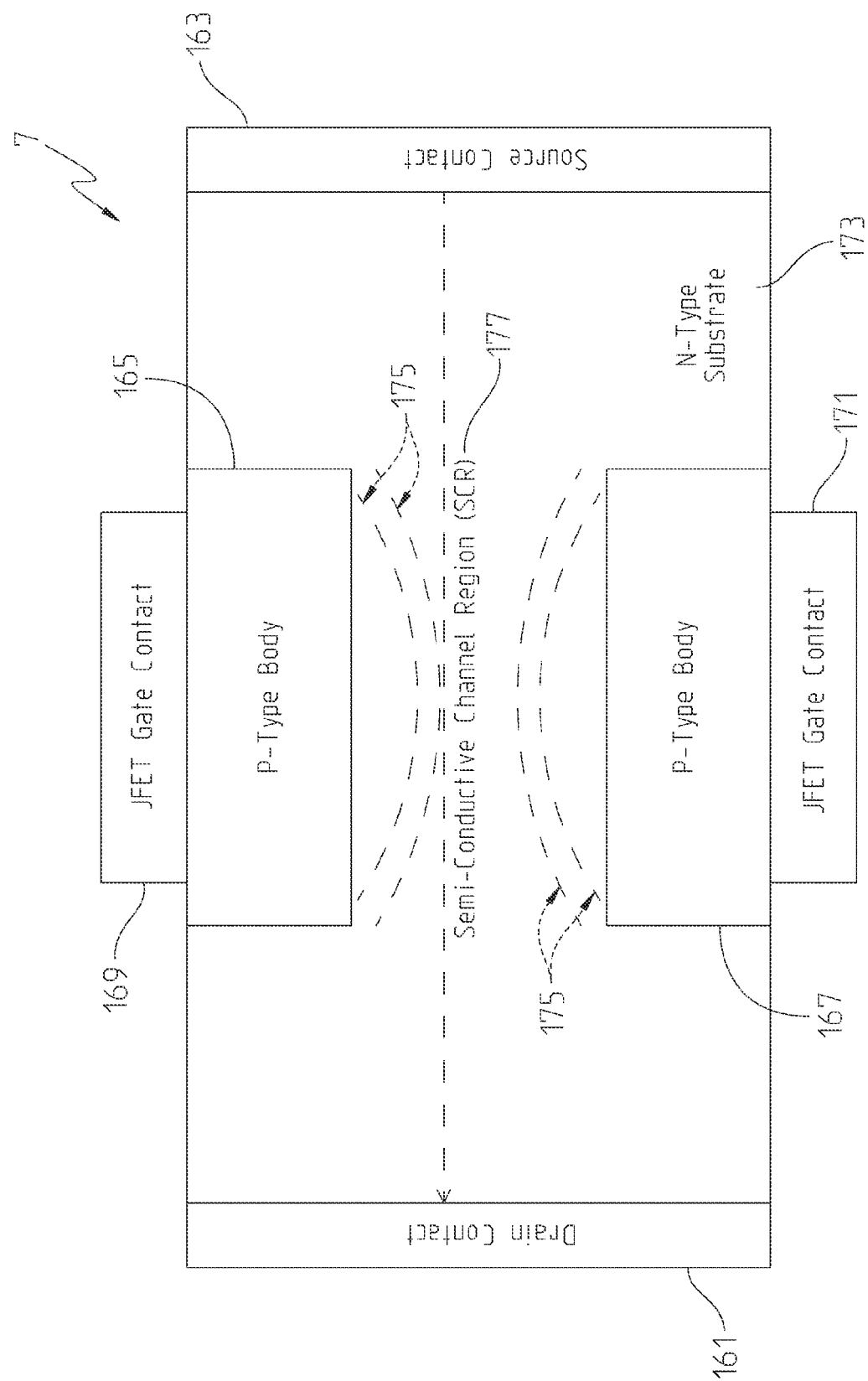
FIG. 6 shows a simplified cross-sectional view of a P-channel JFET.
Figure 7:
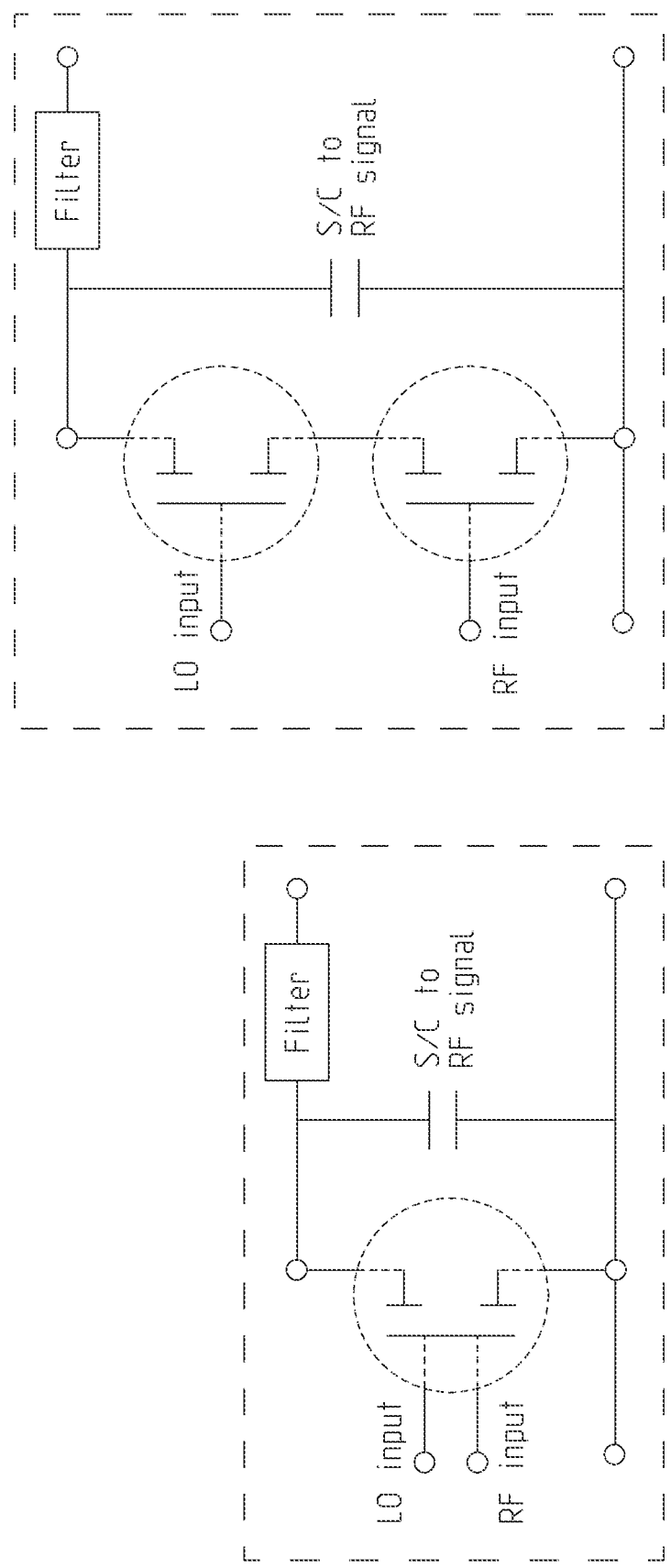
FIG. 7 provides a simplified RF application using a dual gate transistor solution and another using a two transistor solution.
Figure 8:
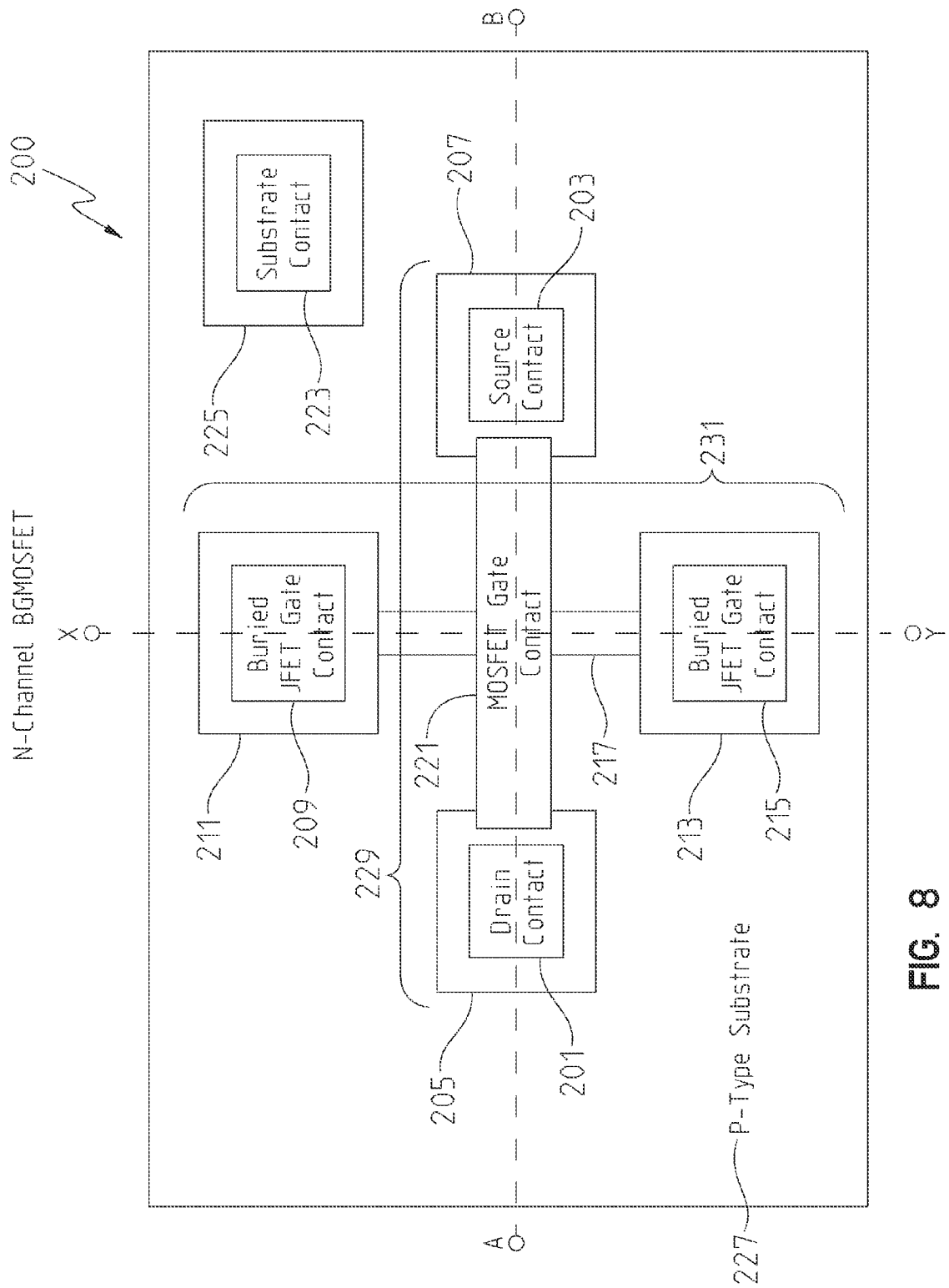
FIG. 8 shows a simplified cross-sectional top view of an exemplary N-channel BGMOSFET in accordance with one embodiment of the invention.
Figure 9:
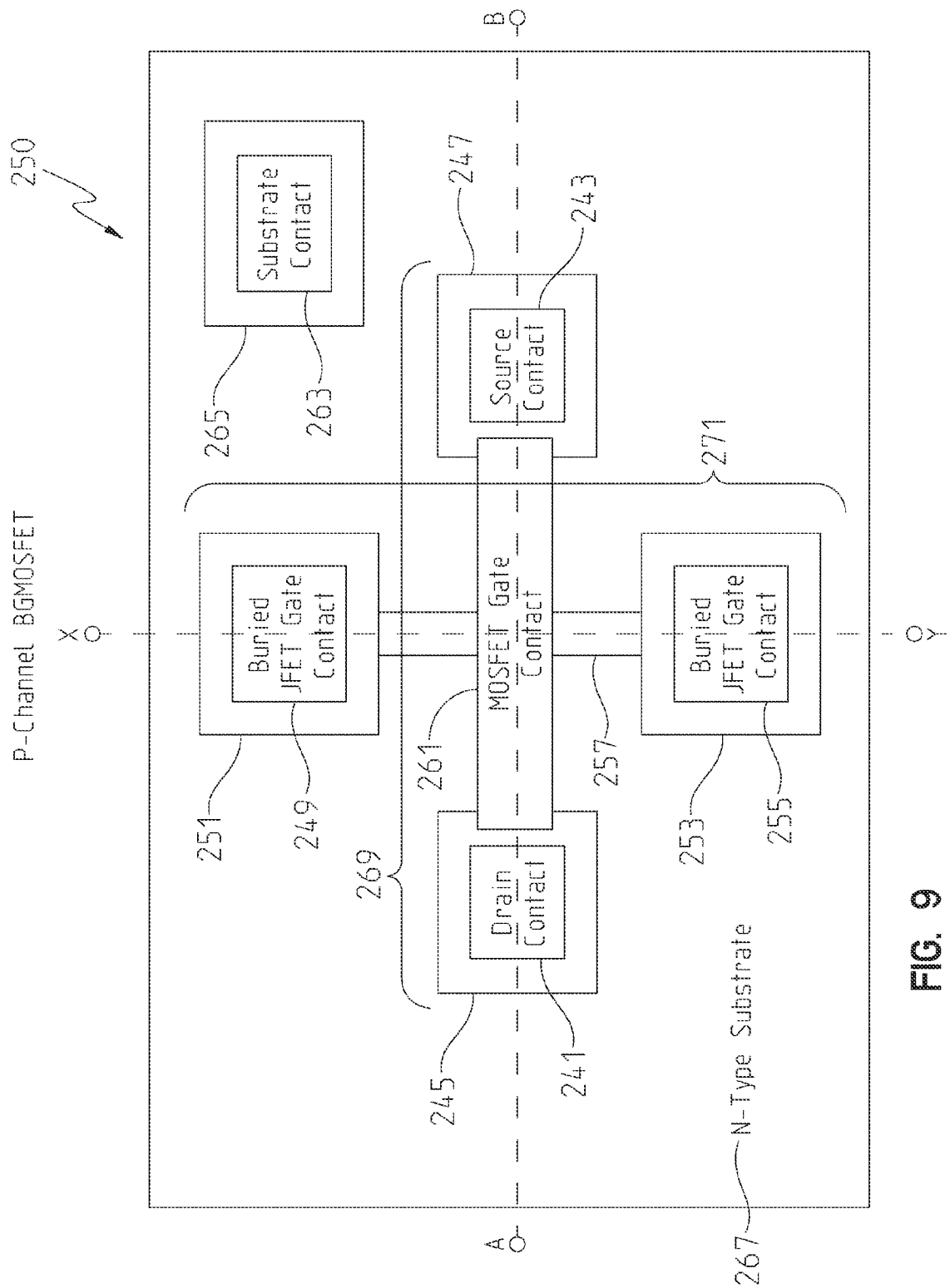
FIG. 9 shows a simplified cross-sectional top view of an exemplary P-channel BGMOSFET in accordance with one embodiment of the invention.

FIGS. 8 and 9 depicts a top-view of one exemplary BGMOSFETs 200 (N-channel version), 250 (P-channel version), respectively that include a MOSFET gate 221 and buried JFET gate 217 (FIG. 8) or a MOSFET gate 261 and buried JFET gate 257 (FIG. 9). The exemplary BGMOSFET includes a doped buried region 217, 257 that traverses an entire width of a channel but resides beneath the actual channel region. Substrate connectivity can be achieved by using a top side contact 223,263 or backside contact 235, 275 (shown in FIGS. 10 and 11). The exemplary BGMOSFET (e.g., 200, 250') design/layout can be fabricated using common layout schemes such as stripe; rectangular; and hexagonal. The exemplary BGMOSFET structure (referred to as a cell) can be replicated and placed in parallel to provide different operational capabilities (e.g., current handling capability) depending upon number of cells that are replicated and placed in parallel.

FIG. 8 includes a P-Type Substrate 227 (e.g., a P-doped silicon layer) that is used to form a MOSFET structure 229 comprising 201/203/205/207/221/227 and used to form a JFET structure 231 comprising 209/211/213/215/217/227 where the JFET gate traverses below the MOSFET gate inside the P-Type substrate 227. The MOSFET structure 229 includes a MOSFET gate contact 221 disposed overlapping a portion of N-Body 207 (N-body forms a source region) extending over a portion of the P-type substrate 227, and overlapping a portion of N-Body 205 (N-body 205 forms a drain region). In this example, a MOSFET gate oxide is disposed underneath the MOSFET gate contact 221 but is not shown due to the cutaway nature of this view. A drain contact 201 is disposed within an N-body 205 (forming a drain region) and a source contact 203 is disposed within an N-body 207 (forming a source region). The JFET structure 231 includes a buried N-type body 217 disposed below a MOSFET gate contact 221 and gate oxide (not shown) inside the P-Type substrate 227 connecting two disposed N-type body regions 211 and 213. A buried gate contact 209 is disposed within the N-type body 211 and a second buried gate contact 215 is disposed within the N-type body 213 (although not shown, the two buried gate contacts 209, 215 are connected together as part of the design/layout). The MOSFET structure 229 and the JFET structure 231 are disposed within a P-Type substrate layer 227. In this exemplary embodiment, the JFET structure 231 is disposed within the P-Type substrate 227 such that when the JFET is operated, an electrical field can decouple the semi-conductive channel region of the MOSFET structure 229 without said electrical field extending into the MOSFET's N-body regions 205 and 207 nor does said depletion field extend to the bottom of the P-type substrate 227 (proper layout/design of buried JFET gate prevents electrical field from infringing upon these areas).

The exemplary FIG. 9 embodiment includes an N-Type Substrate 267 (e.g., N-doped silicon layer) that is used to form a MOSFET structure 269 comprising 241/243/245/247/267 and used to form a JFET structure 271 comprising 249/251/253/255/257/267 where the JFET N-type body region traverses a region under the MOSFET gate inside the substrate. The MOSFET structure 269 includes a MOSFET gate contact 261 disposed over a portion of P-Body 247 (N-body forms a source region) extending over a portion of the N-type substrate 267, and over a portion of P-Body 245 (P-body 205 forms a drain region). In this example, a MOSFET gate oxide is disposed underneath the MOSFET gate contact 261 but is not shown due to the cutaway nature of this view. A drain contact 241 is disposed within the P-body 245 (forming the drain region) and a source contact 243 is disposed within the P-body 247 (forming the source region). The JFET structure 271 includes a buried P-type body 257 disposed below MOSFET gate contact 261 and gate oxide (not shown) inside the N-Type substrate 267 connecting two disposed P-type body regions 249 and 253. A buried gate contact 249 is disposed within a P-type body 251 and a second buried gate contact 255 is disposed within another P-type body 253 (although not shown, the two buried gate contacts 249, 255 are connected together as part of the design/layout). The MOSFET structure 269 and JFET structure 271 are disposed within an N-Type substrate layer 267. In this exemplary embodiment, the JFET structure 271 is disposed within the N-Type substrate 267 such that when the JFET is operated, the depletion field can decouple the semi-conductive channel region of the MOSFET structure 269 without said depletion field extending into the MOSFET's N-body regions 245 and 247 nor does said depletion field extend to the bottom of N-type substrate 267 (proper layout/design of buried JFET gate prevents electrical field from infringing upon these areas). FIG. 8 depict cut lines (A-B and X-Y) representing vertical cut lines defining views in FIG. 10 (A-B) and FIG. 12 (X-Y). FIG. 9 depict cut lines (A-B and X-Y) representing vertical cut lines defining views in FIG. 11 (A-B) and FIG. 13 (X-Y).

Figure 10:
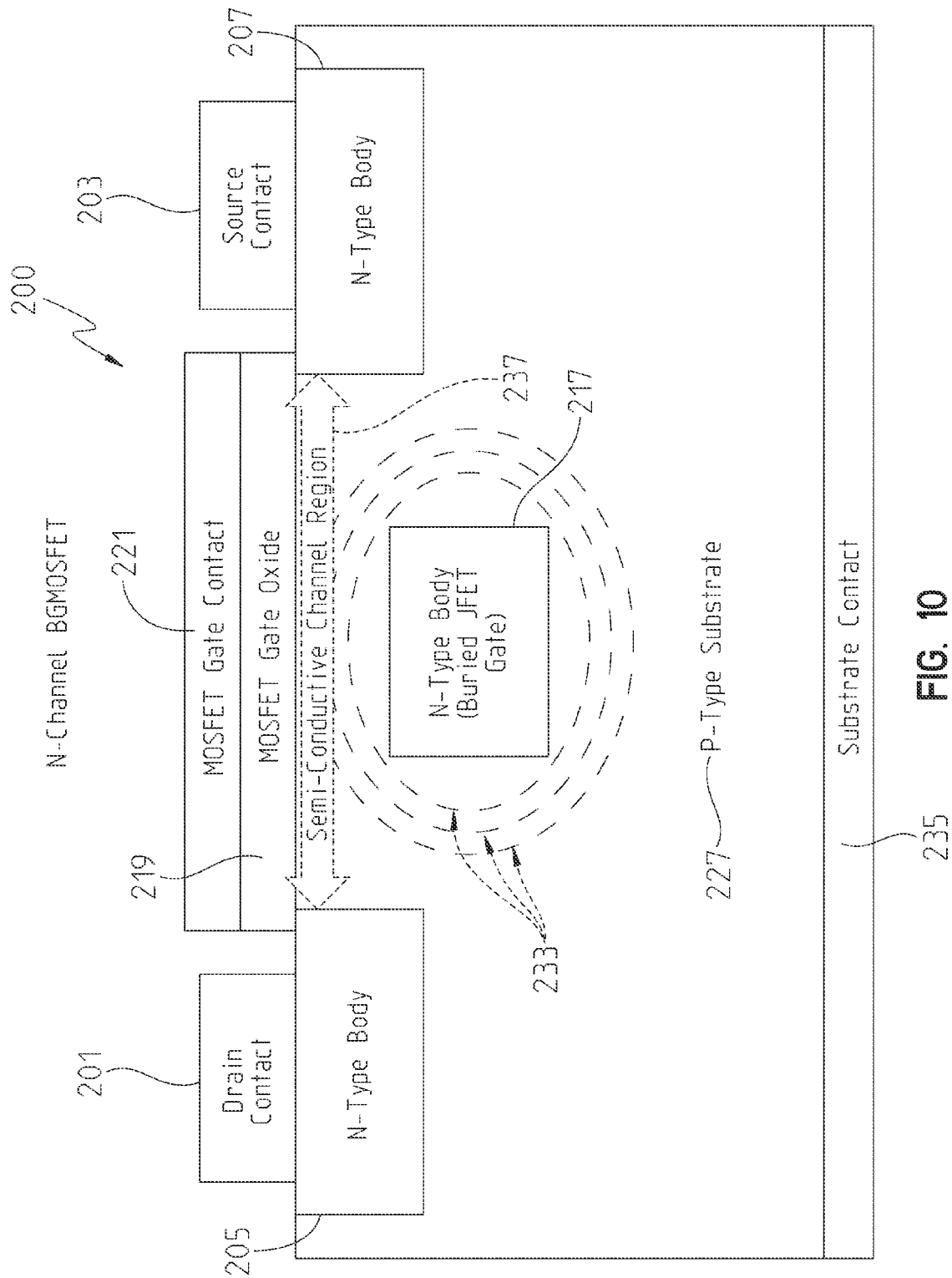
FIG. 10 shows a simplified cross-sectional side view of an exemplary N-channel BGMOSFET in accordance with one embodiment of the invention.
Figure 12:
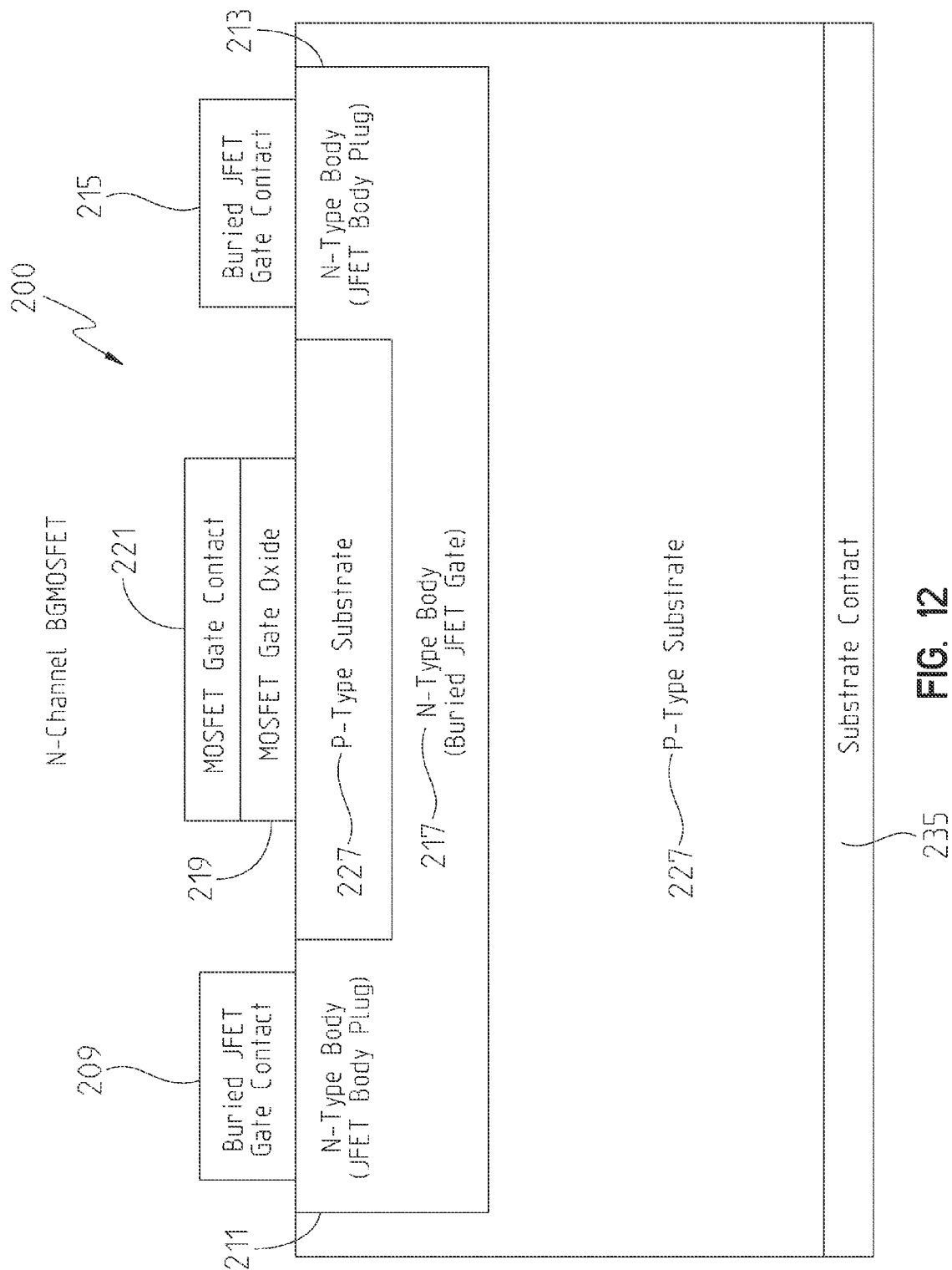
FIG. 12 shows a simplified cross-sectional side view of an exemplary P-channel BGMOSFET in accordance with one embodiment of the invention.

FIG. 10 represents a simplistic cross-sectional side view (a vertical cut along line A-B in FIG. 8 providing a vertical view parallel to a drain and source and along the semi-conductive channel region) and FIG. 12 represents a simplistic cross-sectional side view (a vertical cut along line X-Y in FIG. 8 providing a vertical view parallel to JFET gate contacts and along the buried JFET gate) of the exemplary N-channel BGMOSFET in accordance with one embodiment of the invention. FIGS. 10 and 12 provide elements of exemplary N-channel BGMOSFET structure 200 that cannot be seen in the FIG. 8 cross-sectional cutaway top view. For example, FIG. 10 shows a MOS gate oxide 219 disposed between MOSFET gate contact 221 and N-Type body 205/P-Type substrate 227/N-Type Body 207. The semi-conductive channel region (SCR) 237 is provided in FIG. 10 and SCR 237 also represents one portion of the electrical current path. SCR 237 is created as a result of design of the MOSFET structure 229—for example, SCR 237 can be a region in lateral proximity to N-Type body 207 underneath a portion of MOSFET gate oxide 219 extending laterally across the P-type substrate 227 to the N-Type body 205 underneath a portion of MOSFET gate oxide 219 next to the boundary of P-Type substrate 227 and MOSFET gate oxide 219. A second gate used to control a portion of the SCR 237 is formed by a JFET structure 231 (e.g., an N-type body 217 is disposed below a section of the gate oxide 219 inside the P-Type substrate 227 and disposed in between the N-Type body 205 and N-type body 207 and located near the midpoint of these two bodies forming a buried PN junction inside the P-type substrate 227 and spatially located below a portion of SCR 237 below a portion of SCR 237, where N-type body 217 is contained within the P-Type substrate 227 on all four sides as shown in FIG. 12). In FIG. 10, dashed gray lines 233 are shown which exemplify production of an electrical field created by JFET structure 231 when it is biased with an electrical power supply. A substrate contact 235 is disposed on the bottom of P-Type substrate 227 (e.g., substrate contact can be made from the bottom as shown or from the top of the structure as shown in FIG. 8 substrate contact 223).

Figure 11:
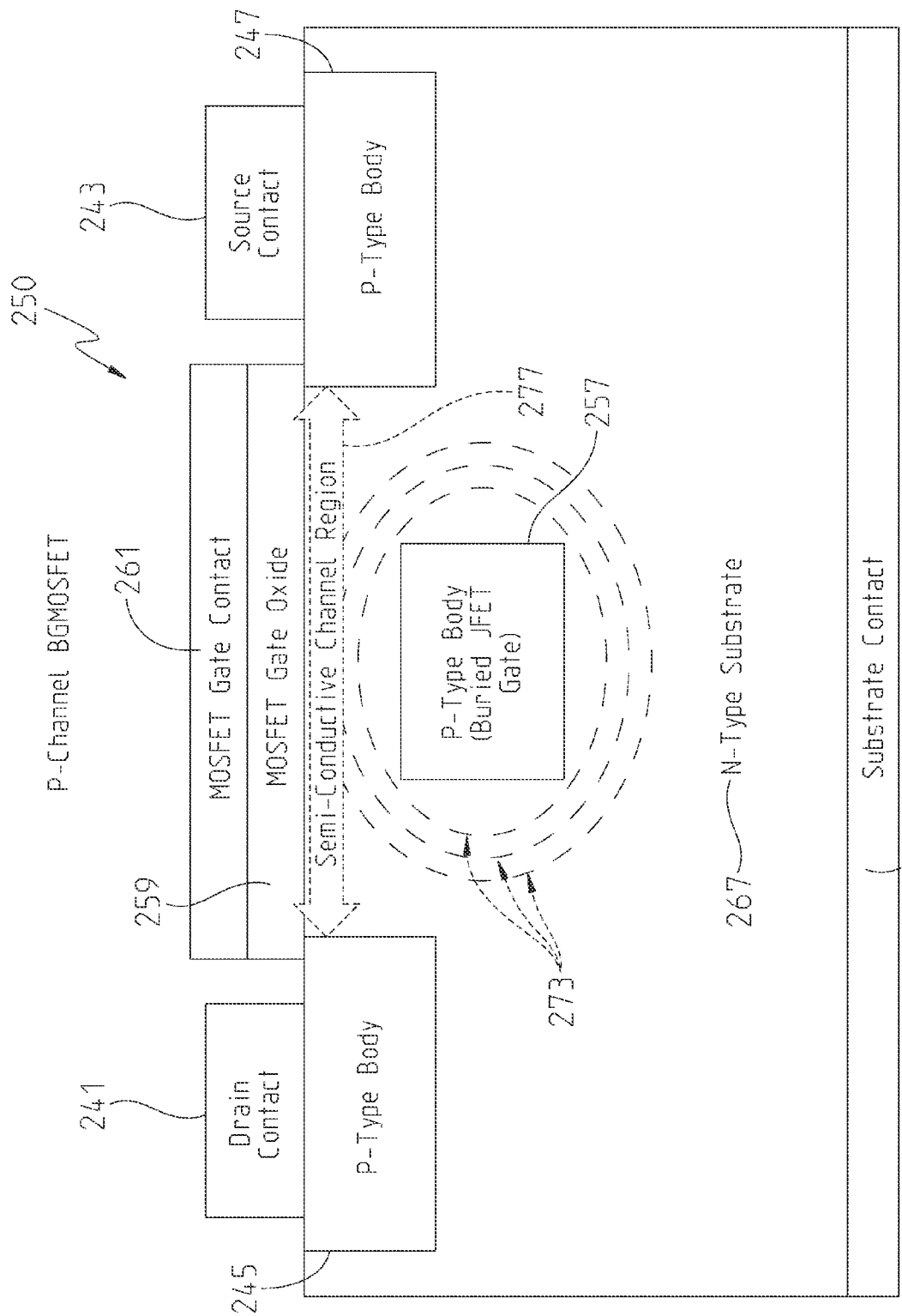
FIG. 11 shows a simplified cross-sectional side view of an exemplary P-channel BGFET in accordance with one embodiment of the invention.
Figure 13:
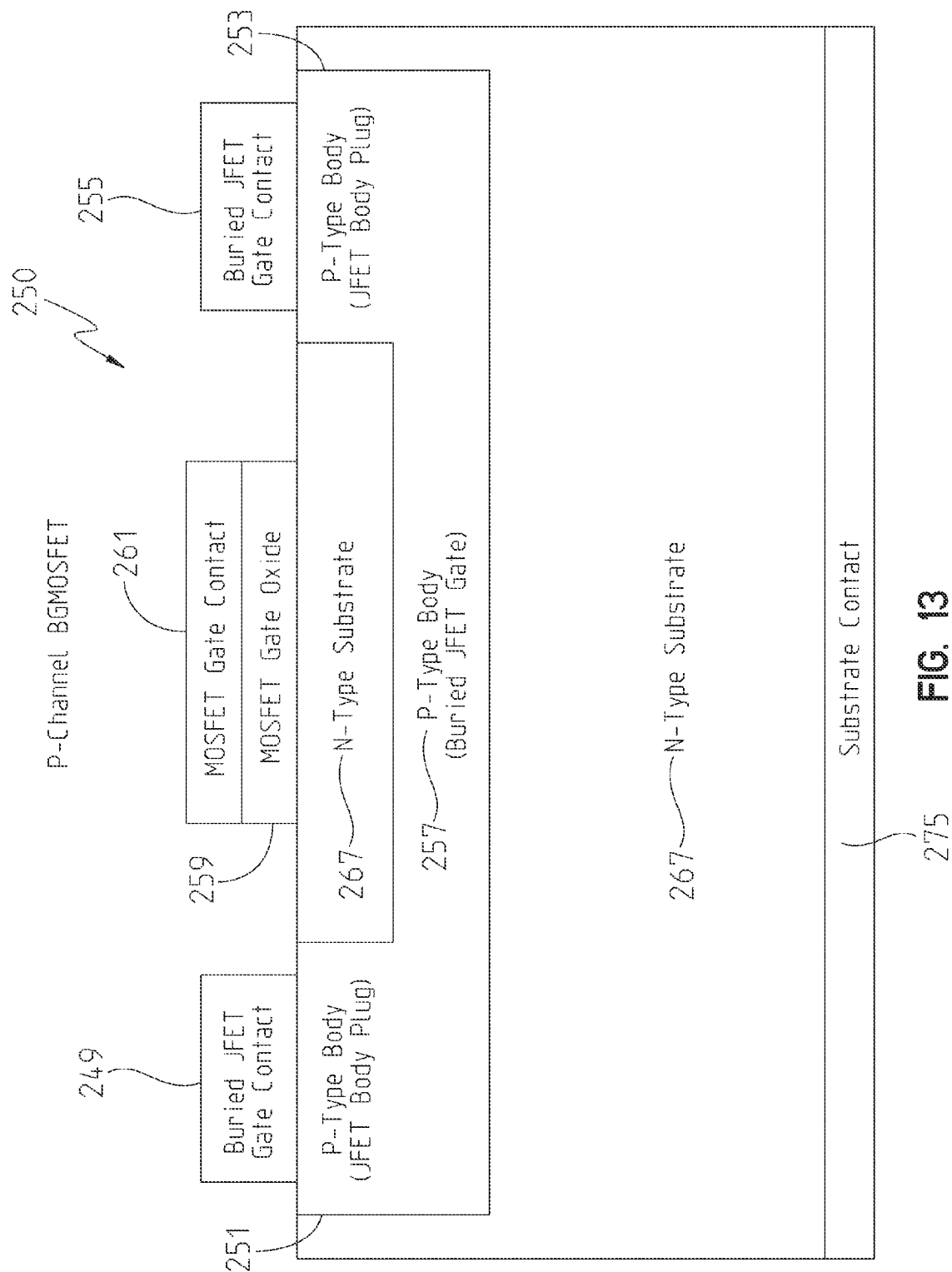
FIG. 13 shows a simplified cross-sectional side view of an exemplary N-channel BGMOSFET in accordance with one embodiment of the invention.

FIG. 11 presents an exemplary simplistic cross-sectional side view (along A-B cut line in FIG. 9) and FIG. 13 presents a simplistic cross-sectional side view (along X-Y cut line in FIG. 9) of the exemplary P-channel BGMOSFET in accordance with one embodiment of the invention. FIGS. 11 and 13 provide elements of exemplary P-channel BGMOSFET structure 250 that cannot be seen in the FIG. 9 cross-sectional cutaway top view. For example, FIG. 11 shows a MOSFET gate oxide 259 disposed between MOSFET gate contact 261 and P-Type body 245/N-Type substrate 267/P-Type Body 247. The semi-conductive channel region (SCR) 277 is provided in FIG. 11 and SCR 277 also represents one portion of the electrical current path. SCR 277 is created as a result of design of the MOSFET structure 269—for example, SCR 277 can be a region in lateral proximity to P-Type body 247 underneath a portion of MOSFET gate oxide 259 extending laterally across the N-type substrate 267 to the P-Type body 245 underneath a portion of MOSFET gate oxide 259 next to the boundary of N-Type substrate 267 and MOSFET gate oxide 259. A second gate used to control a portion of the SCR 277 is formed by a JFET structure 271 (e.g., an P-type body 257 is disposed below a section of the gate oxide 259 inside the N-Type substrate 267 and disposed in between the P-Type body 245 and P-type body 247 and located near the midpoint of these two bodies forming a buried PN junction inside the N-type substrate 267 and is spatially located below a portion of SCR 277, where P-type body 257 is contained within the P-Type substrate 267 on all four sides. In this example dashed gray lines 273 are shown which exemplify production of an electrical field created by JFET structure 271 when it is biased with an electrical power supply. A substrate contact 275 is disposed on the bottom of N-Type substrate 267 (e.g., substrate contact can be made from the bottom as shown or from the top of the structure as shown in FIG. 9 substrate contact 263).

In above example, there is one SCR 237 (for N-channel) or 277 (for P-channel) formed as a result of the design shown in FIGS. 8-11 as part of the MOSFET structure 229 (for N-channel) or 269 (for P-channel) underneath the MOSFET gate oxide 219 (for N-channel) or 259 (for P-channel). In this embodiment, the SCR 237 (for n-channel) and 277 (for p-channel) regulates current through the MOSFET structure 229 (for N-channel) and 259 (for P-channel) where the current is controlled by voltage applied to the MOSFET gate contact 221 (for N-channel) and 261 (for P-channel) and by voltage applied to the JFET gate contact 209, 215 (for N-channel) and 249, 155 (for P-channel). Having two control gates provides two independent gate-type functions or capabilities that are useful for mixing signals as well as providing benefits from a radiation hardening or performance perspective. The MOSFET structure 229 (for N-channel) and 269 (for P-channel) are sensitive to radiation degradation that can be compensated for or eliminated by use of the JFET buried gate of the electrical field effect 233 (for N-channel) and 273 (for P-channel) extending through the substrate 227 (for P-channel) and 267 (for N-channel) and SCR 237 (for N-channel) and 277 (for P-channel) up to the gate oxide 219 (for N-channel) and 259 For (P-channel) allowing the electrical flow path (e.g., SCR 237, 277) to be altered. Various negative effects can be mitigated or eliminated by embodiments of this invention such as TID. As an example, TID effects can cause the MOSFET's portion of SCR 237 (for N-channel) to become permanently turned on; however, TID effects do not affect the operation of the electrical field effect of a buried JFET gate providing an alternate method to regulate the SCR 237 current flow. The exemplary N-channel BGMOSFET 200 design differs from the exemplary P-channel BGMOSFET 250 design in those references to N-Type becomes P-Type references and references to P-type become N-Type references. Element numbers used for elements in exemplary N-channel BGMOSFET design are different from the element numbers used for elements in exemplary P-channel BGMOSFET design. References to the MOSFET structure and the JFET structure are also different between the exemplary N- and P-channel BGMOSFETs.

An embodiment can include an exemplary control or sensor system that could also be provided for (not shown) which would operate embodiments such as the FIG. 8/10/12 (and/or FIGS. 9/11/13) MOSFET structure 229 (or 269) and the JFET structure 231 (or 271) in response to detected radiation fields or energy. For example, a control section can have a pulse width modulator (not shown) which would operate the MOSFET structure 229 (or 269) and JFET structure 231 (or 271) in order to reduce or adjust radiation-induced currents or other aspects of operation of this system.

A feedback circuit or look up table can be utilized by the control section (not shown) which can correlate operation of the MOSFET structure 229 (or 269) and the JFET structure 231 (or 271) which in turn generates effects in the SCR 237 (or 277) to increase radiation hardening or facilitate additional modulation schemes performed by an embodiment of the invention.

Figure 14:
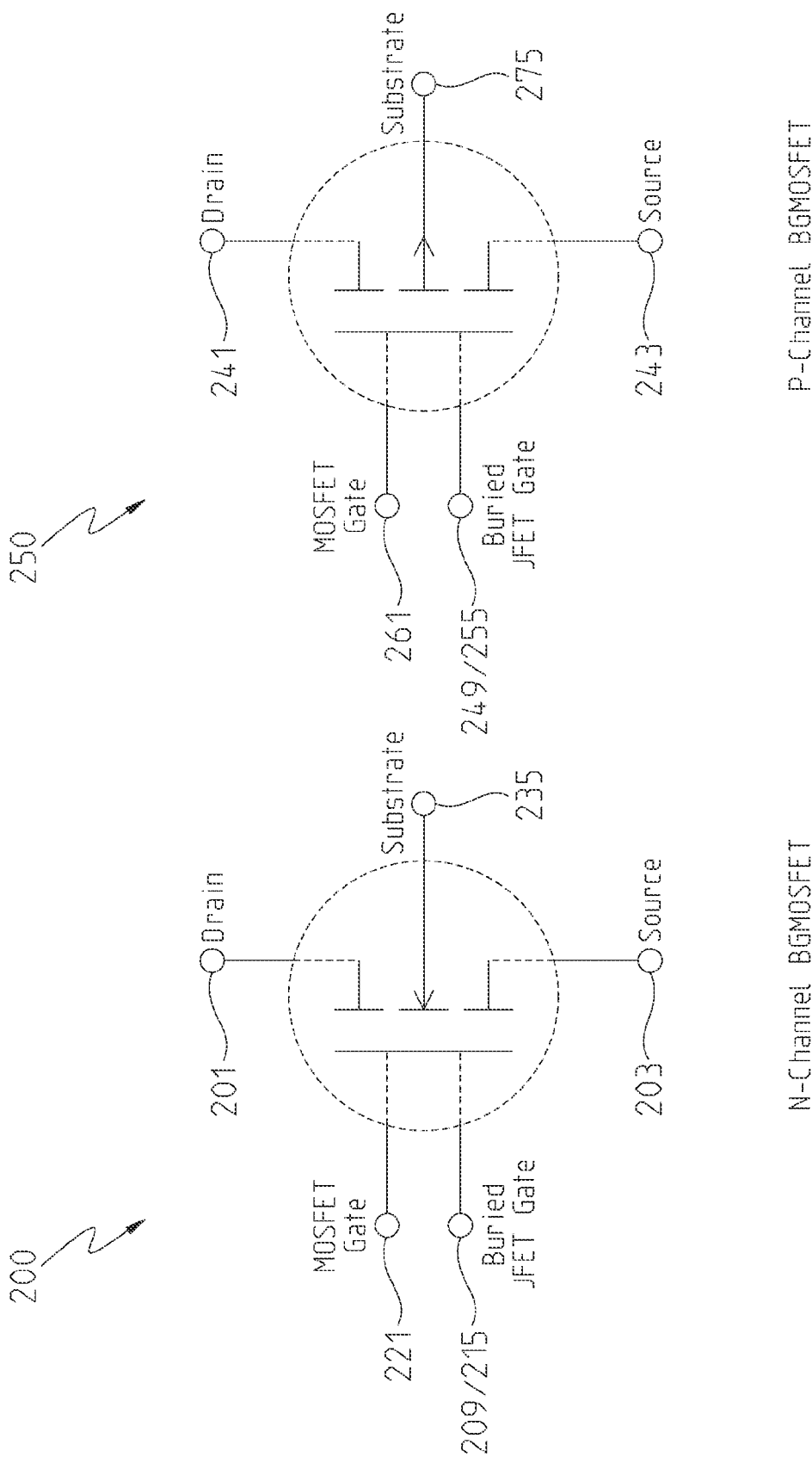
FIG. 14 shows an exemplary representation of an applicable circuit symbol associated with an exemplary BGMOSFET.

FIG. 14 shows a simplistic electrical representation of an exemplary N-channel BGMOSFET 200 and a P-channel BGMOSFET 250 in accordance with the embodiment of the invention, where the electrical representation provide inputs and outputs such as drain 201, 241; source 203, 243; MOSFET gate 221,261; buried JFET gate 209/215, 249/255; and substrate 235, 275.

Figure 15:
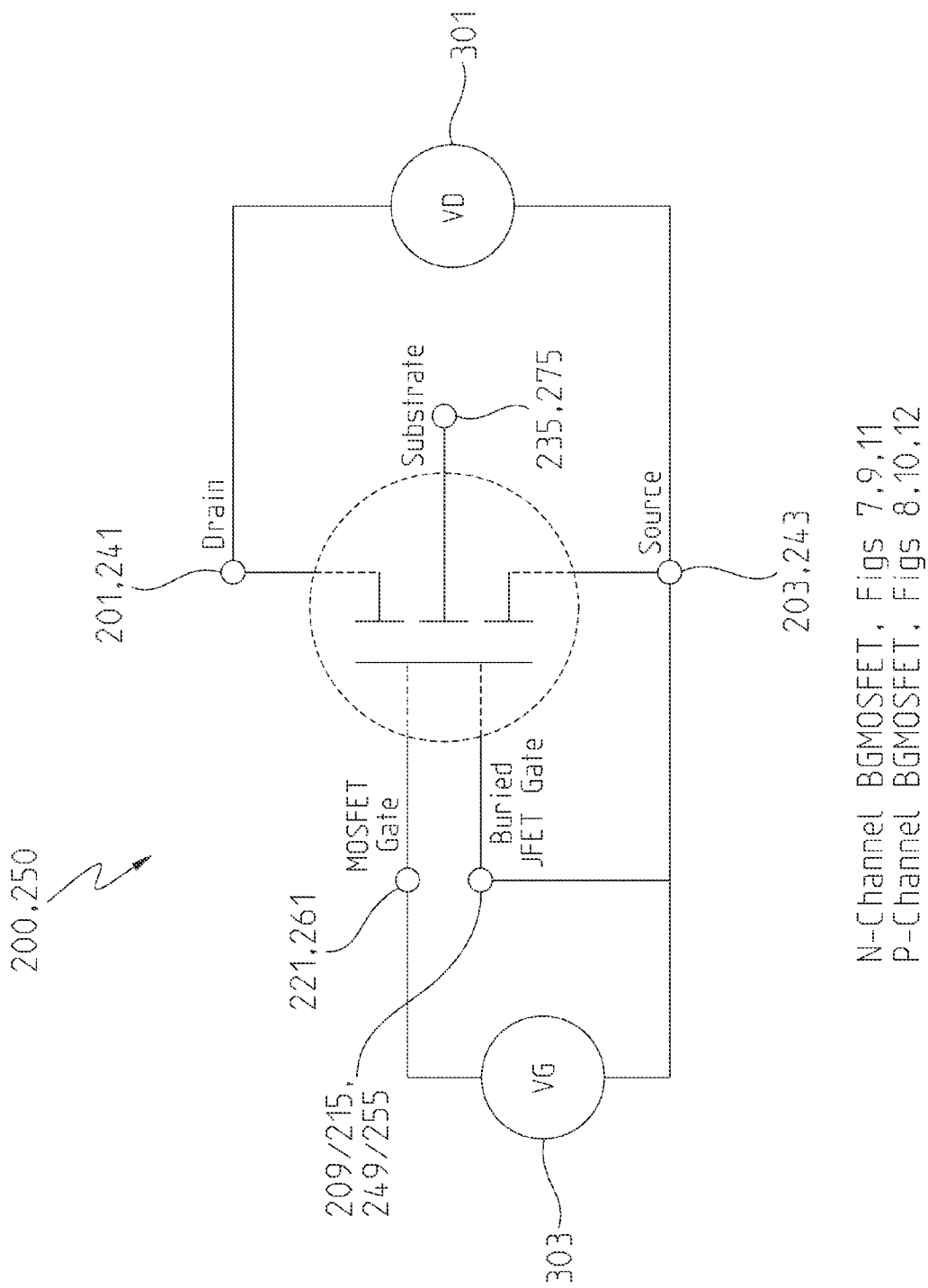
FIG. 15 shows an exemplary BGMOSFET configured to operate in one standard DC mode configuration in accordance with one embodiment of the invention.
Figure 16:
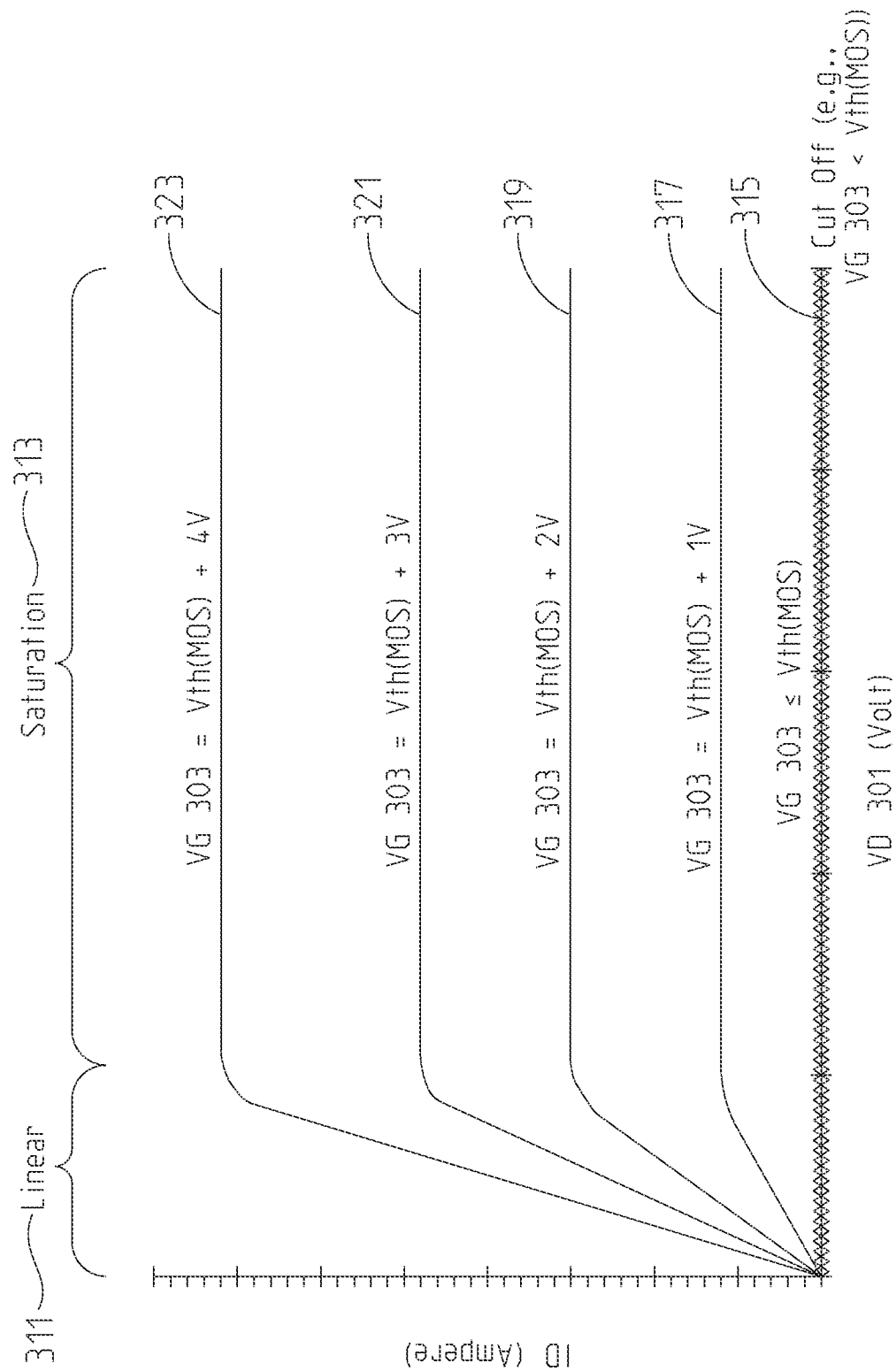
FIG. 16 shows an exemplary current-voltage (I-V) response (operation of an exemplary standard DC mode configuration of FIG. 15) in accordance with one embodiment of the invention.

FIG. 15 shows an exemplary application (Standard DC Mode Configuration) of exemplary BGMOSFET 200, 205 electrical symbols shown in FIG. 14 in accordance with one embodiment of the invention. FIG. 15 schematic representation shows external gate power VG 303 connected to a MOSFET gate 221, 261; an external power VD 301 connected to a drain 201, 241; and external circuit common (e.g., ground) connected to a source 203, 243 and buried JFET gate 209/215, 249/255 coupled to exemplary BGMOSFET embodiment 200, 250. Referring back to FIGS. 8/10/12, 9/11/13 in view of FIGS. 15/16, if buried JFET gate contact 209/215, 249/255 is connected directly to the source contact 203, 243, the exemplary embodiment of the exemplary BGMOSFET 200, 250 can be configured to function similar to a standard MOSFET providing similar electrical characteristics and performance of a standard MOSFET. FIG. 16 shows an example of five exemplary standard DC mode I-V responses or outputs (I-V responses 315, 317, 319, 321 and 323) of FIG. 15 exemplary application (Standard DC Mode configuration) in accordance with one embodiment of the invention. FIG. 16 also provides three regions of exemplary operation (cut-off 315, linear 311, and saturation 313). Cut-off 315 can be operable in FIG. 15 exemplary application if external power VG 303 delivers a voltage to gate less than MOSFET's gate threshold voltage Vth (MOS) to effect a reduction or elimination of BGMOSFET's current flow through MOSFET's semiconductive channel region 237, 277. Linear 311 can be operable in FIG. 15 exemplary application if external power VG 303 delivers a voltage to gate greater than MOSFET's gate threshold voltage Vth (MOS) to enter an exemplary resistive BGMOSFET current flow through MOSFET's semi-conductive channel region 237, 277, where external power VD 301 delivers a voltage to drain less than the difference of VG 303 and Vth (MOS). Saturation 313 can be operable in FIG. 15 exemplary application if external power VG 303 delivers a voltage to gate greater than MOSFET's gate threshold voltage Vth (MOS) to enter exemplary saturated BGMOSFET current flow (saturation) through MOSFET's semi-conductive channel region 237, 277, where external power VD 301 delivers a voltage to drain greater than the difference of VG 303 and Vth (MOS). FIG. 16 does not necessarily represent an actual BGMOSFET's I-V response but is only provided to show how one embodiment of an exemplary BGMOSFET would operate in a standard DC mode configuration. Operation of an exemplary BGMOSFET in standard DC mode configuration may not enhance TID performance.

Figure 17:
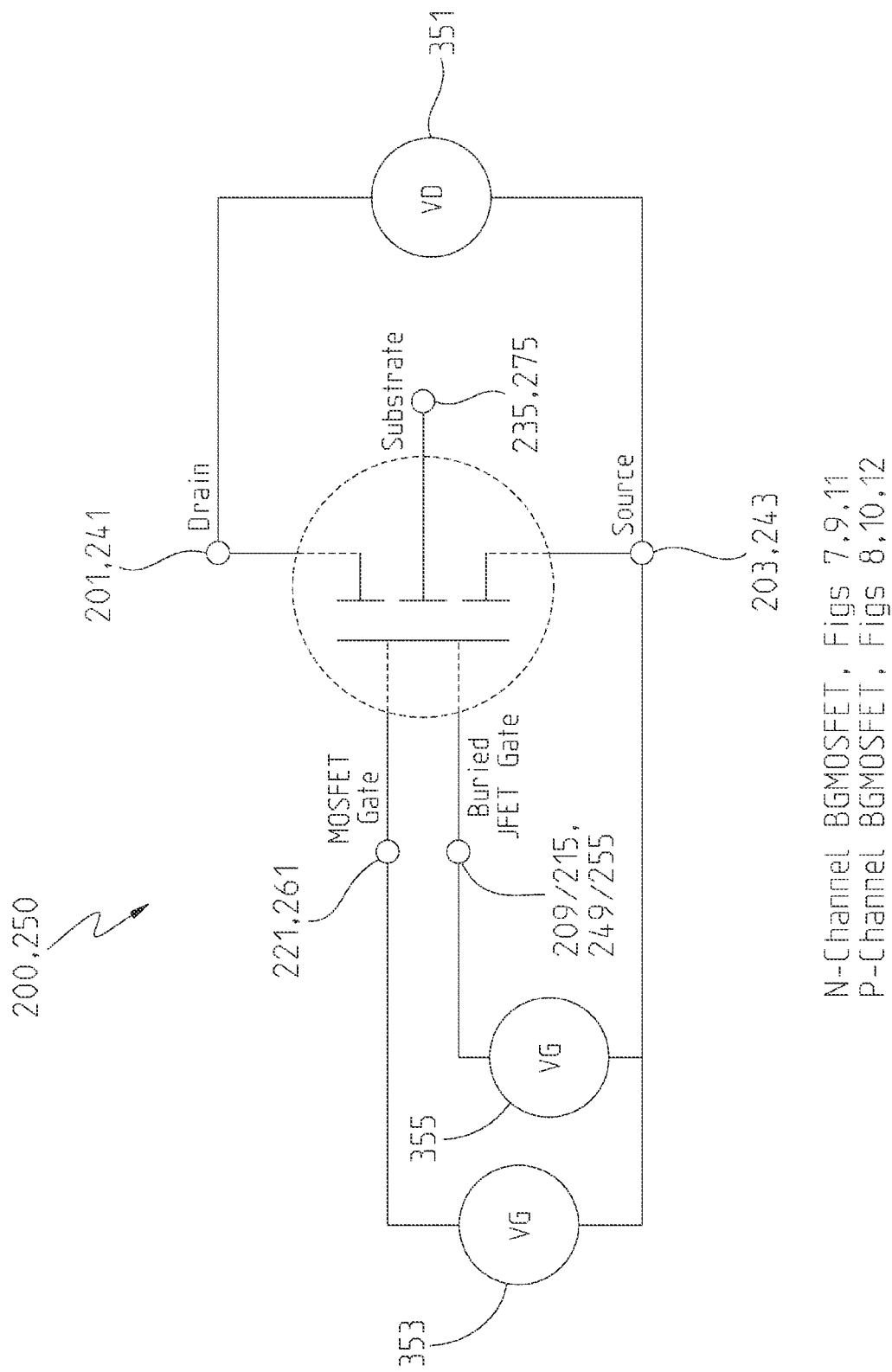
FIG. 17 shows an exemplary BGMOSFET configured to operate in one enhanced DC mode configuration in accordance with one embodiment of the invention.

FIG. 17 shows an exemplary application (Enhanced DC mode configuration) of exemplary BGMOSFET 200, 205 electrical symbols shown in FIG. 14 in accordance with one embodiment of the invention. FIG. 17 simplified exemplary schematic representation shows external power VG 353 connected to a MOSFET gate 221, 261; external power VG 355 connected to a buried JFET gate 209/215, 249/255; external power VD 351 connected to a drain 201, 241; and external power common (e.g., ground) connected to a source 203, 243 coupled to the exemplary BGMOSFET embodiment 200, 250. In this exemplary configuration, the MOSFET gate 221, 261 and the buried JFET gate 209/215, 249/255 can be used separately or together to assist in controlling the exemplary BGMOSFET's current flow. The exemplary BGMOSFET 200, 250 can be configured to function similar to a standard MOSFET (e.g., set external power VG 355 to zero volts) providing similar electrical and performance of a standard MOSFET; can be configured to function similar to a standard JFET (e.g., set external power VG 353 to a fixed voltage greater than the MOSFET's threshold voltage) providing similar electrical and performance of a standard JFET; or can be configured to function where both JFET and MOSFET interact (e.g., configure external power VG 353 and VG 355 to both control current flow) providing similar electrical and performance of two transistors connected in series. In this exemplary configuration, the exemplary BGMOSFET 200, 205 offers enhanced operational and performance capabilities with respect to TID. Enhanced TID performance can occur because the exemplary buried JFET gate 209/215, 249/255 can continue to function even after high levels of TID exposure (e.g., TID>1 Mrd) and can be used to control current flow through the BGMOSFET's semi-conducting channel region 237, 277 even after MOSFET gate 221, 261 become non-functional due to TID-induced threshold voltage shifts.

Figure 18:
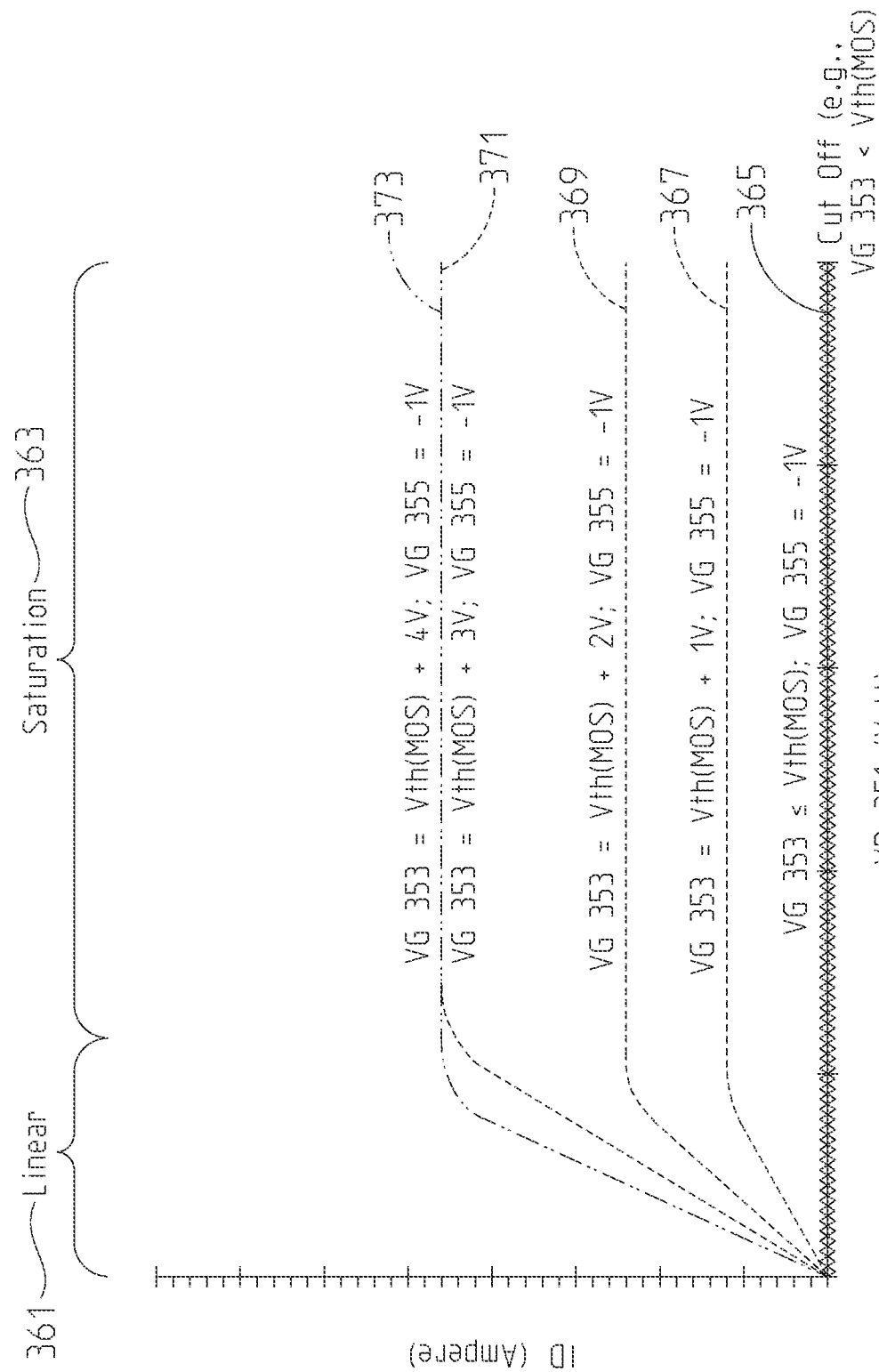
FIG. 18 shows an exemplary current-voltage (I-V) response (operation of exemplary enhanced DC mode configuration of FIG. 17) associated with one element (e.g., MOSFET gate control)

FIG. 18 represents an exemplary current-voltage (I-V) response of exemplary BGMOSFET 200, 250 when exemplary buried JFET gate 209/215, 249/255 is set to a constant voltage and the MOSFET gate 221, 261 is used to modulate current flow. FIG. 18 demonstrates an example of five exemplary enhanced DC mode I-V responses or outputs (I-V responses 365, 367, 369, 371 and 373) of FIG. 17 exemplary application (enhance DC mode configuration) in accordance with one embodiment of the invention. FIG. 18 also depicts three regions of exemplary operation (cut-off 365, linear 361, and saturation 363). Cut-off 365 can be operable in FIG. 17 exemplary application if external power VG 353 delivers a voltage less than MOSFET's gate threshold voltage Vth (MOS) to effect a reduction or elimination of exemplary BGMOSFET's current flow through MOSFET's semi-conductive channel region 237, 277. Linear 361 can be operable in FIG. 17 exemplary application if external power VG 353 delivers a voltage greater than MOSFET's gate threshold voltage Vth (MOS) to enter a resistive BGMOSFET current flow through MOSFET's semi-conductive channel region 237, 277, where external power VD 351 delivers a voltage less than the difference of VG 353 and Vth (MOS). Saturation 363 can be operable in FIG. 17 exemplary application if external power VG 353 delivers a voltage greater than MOSFET's gate threshold voltage Vth (MOS) to enter am exemplary limited BGMOSFET current flow (saturation) through MOSFET's semi-conductive channel region 237, 277, where external power VD 351 delivers a voltage greater than the difference of VG and Vth (MOS).

Figure 19:
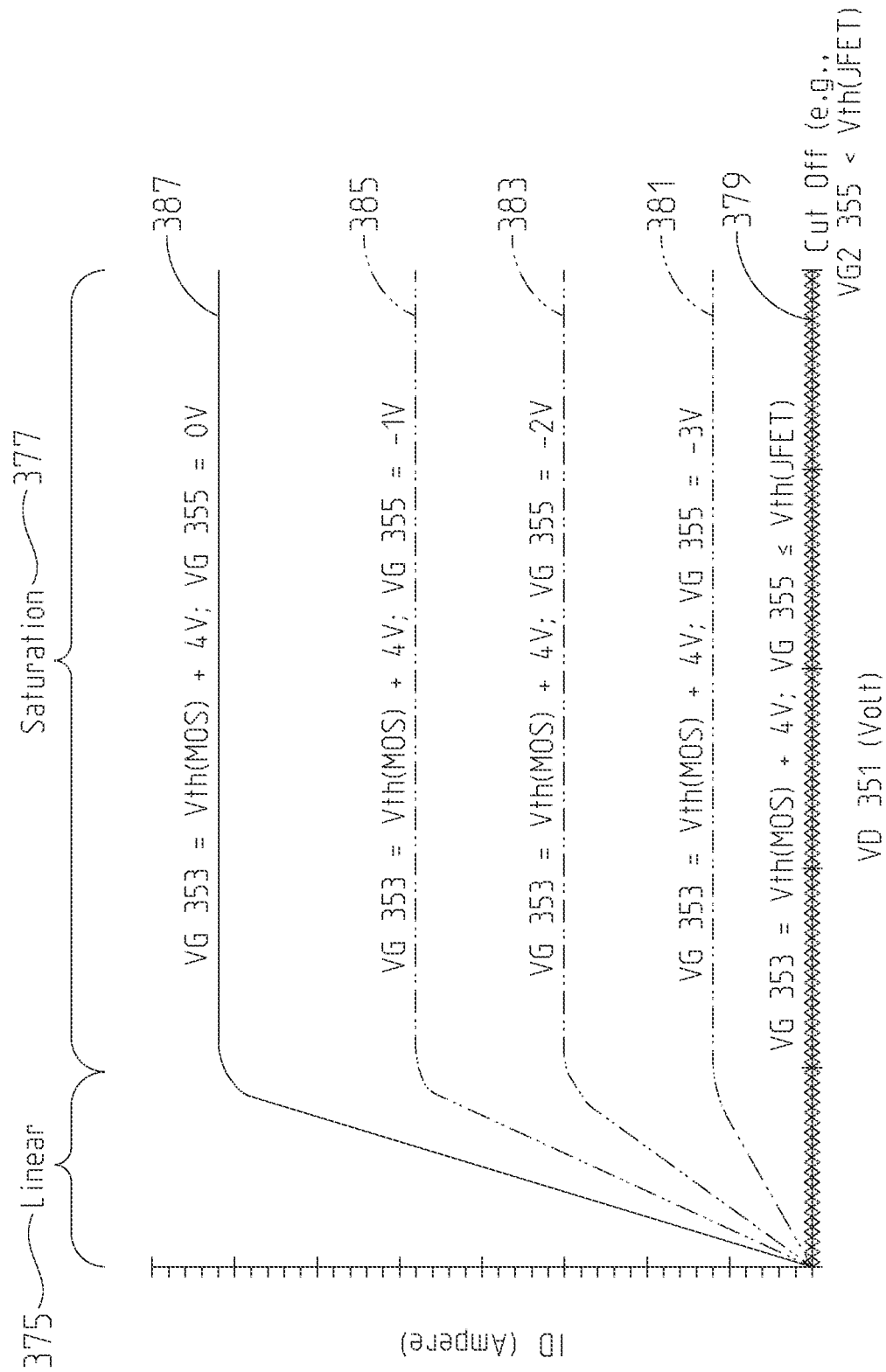
FIG. 19 shows an exemplary current-voltage (I-V) response (operation of exemplary enhanced DC mode configuration of FIG. 17) associated with another element (e.g., buried JFET gate control)

FIG. 19 represents a current-voltage (I-V) characteristic of exemplary BGMOSFET 200, 250 when exemplary MOSFET gate 221, 261 is at a constant voltage and buried JFET gate 209/215, 249/255 is used to modulate current flow. FIG. 19 demonstrates an example of five exemplary responses or outputs (I-V responses 379, 381, 283, 385 and 387) of enhanced DC Mode operation from FIG. 17 exemplary application in accordance with one embodiment of the invention. FIG. 19 also depicts three regions of exemplary operation, cut-off 379, Linear 375, and saturation 377. Cut-off 379 can be operable in FIG. 17 exemplary application when external power VG 355 delivers a voltage less than buried JFET's gate threshold voltage Vth (JFET) to effect a reduction or elimination of exemplary BGMOSFET's current flow through MOSFET's semi-conductive channel region 237, 277. Linear 375 can be operable in FIG. 17 exemplary application when external power VG 355 delivers a voltage greater than buried JFET's gate threshold voltage Vth (JFET) to enter an exemplary resistive BGMOSFET current flow through MOSFET's semi-conductive channel region 237,277, where external power VD 351 delivers a voltage less than the difference of VG and Vth (JFET). Saturation 377 can be operable in FIG. 17 exemplary application when external power VG 355 delivers a voltage greater than JFET's gate threshold voltage Vth (JFET) to enter exemplary limited BGMOSFET current flow (saturation) through MOSFET's semi-conductive channel region 237, 277, where external power VD 351 delivers a voltage greater than the difference of VG and Vth (JFET). FIGS. 18 and 19 do not represent actual BGMOSFET's I-V characteristics and are only provided to demonstrate application of an exemplary BGMOSFET in enhanced DC mode.

Figure 20:
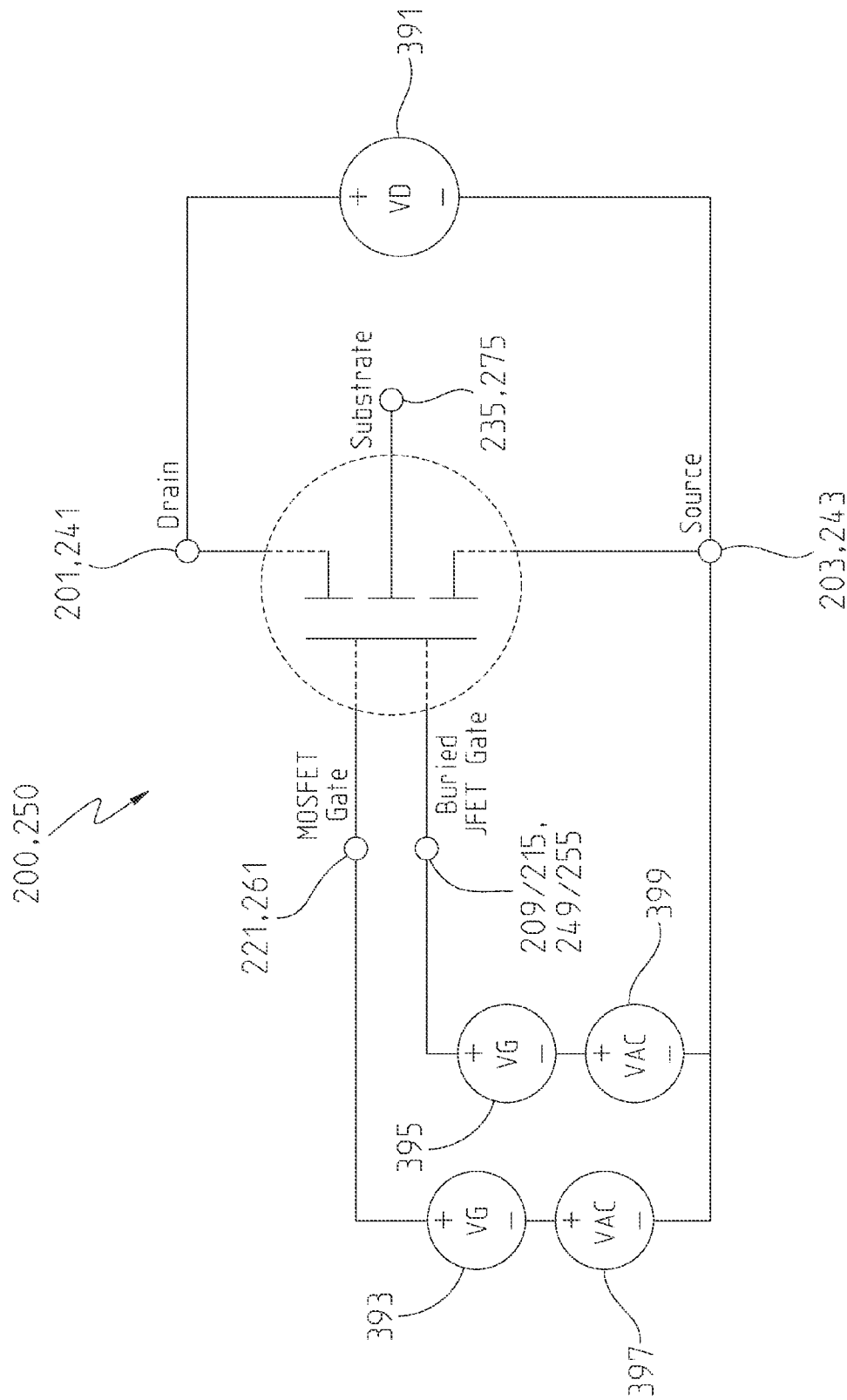
FIG. 20 shows an exemplary BGMOSFET configured to operate in one enhanced AC mode configuration in accordance with one embodiment of the invention.

FIG. 20 shows another exemplary application (e.g., enhanced AC mode configuration) using exemplary BGMOSFET 200, 205 electrical symbols shown in FIG. 14 in accordance with one embodiment of the invention. FIG. 20 schematic representation shows external power VG 393 and an AC input VAC 397 connected to a MOSFET gate 221, 261; external power VG 395 and an AC input 399 connected to buried JFET gate 209/215, 249/255; external power VD 391 connected to drain 201, 241; and external power common (e.g., ground) coupled to exemplary BGMOSFET embodiment 200, 250. In this exemplary application, MOSFET gate 221, 261 and buried JFET gate 209/215, 249/255 can be used separately or together to assist in controlling DC current flow with an AC modulation in phase or out of phase providing a structure for a variety of radio frequency (RF) applications such as RF mixers, RF amplifiers, and RF gain control. This exemplary operational mode provides application designers functionality of two independent gates in a variety of RF type applications.

Figure 21:
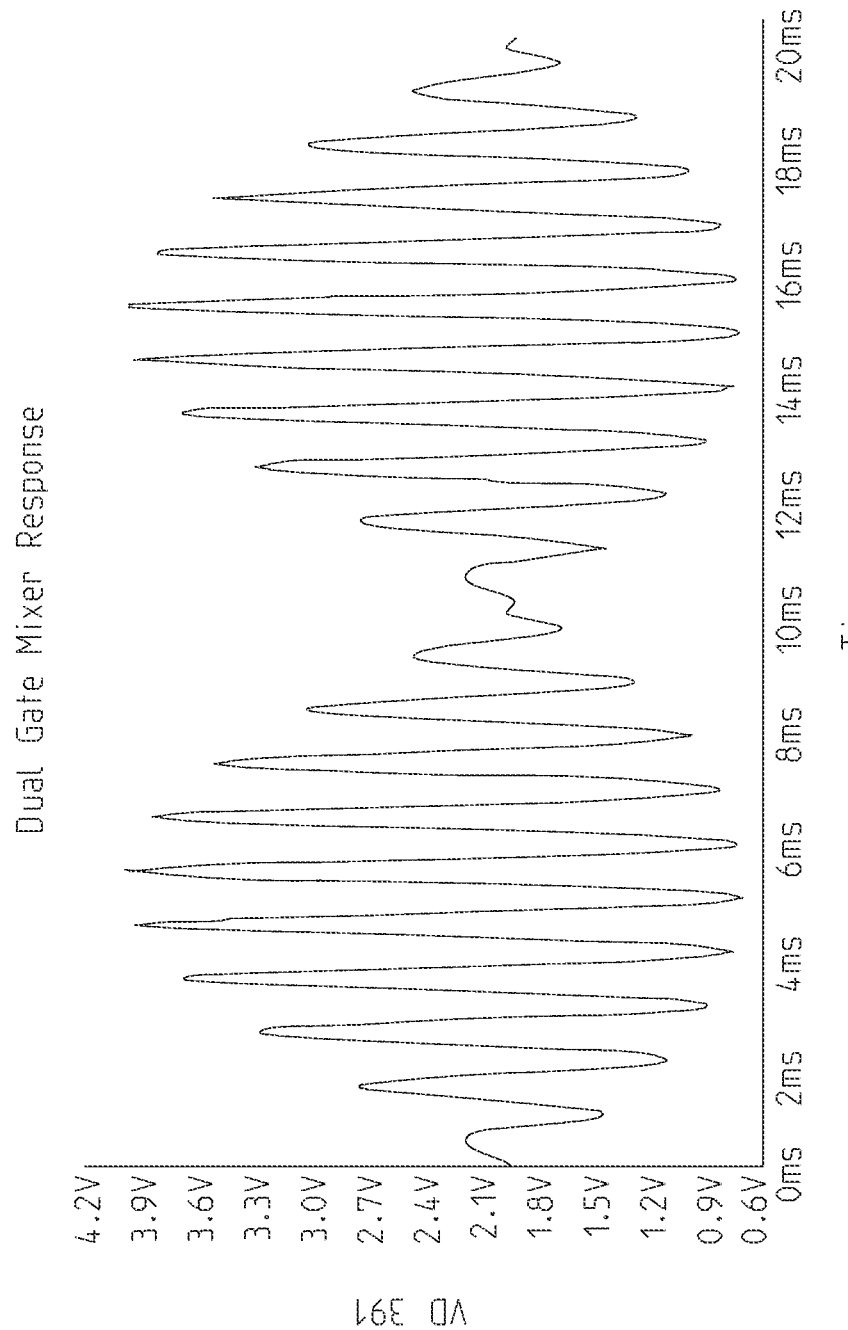
FIG. 21 shows an exemplary RF output (operation of exemplary enhanced AC mode configuration of FIG. 20) associated with two elements (e.g., MOSFET gate control and buried JFET gate control)

FIG. 21 represents an exemplary output of a RF mixer type application. FIG. 21 does not represent an actual BGMOSFET output but is provided demonstrate application of an exemplary BGMOSFET in enhanced AC mode.

A conventional non-rad-hard MOSFET cannot operate in a TID environment without degraded performance of MOSFET's semi-conductive channel region and may even become non-functional (non-functional performance can occur at TID below 10 krd(Si)). An exemplary buried JFET type gate is radiation tolerant (e.g., can exceed TID of 1 Mrd(Si)) and provides an alternative method to control a current flow if an exemplary MOSFET gate becomes degraded or nonfunctional due to TID radiation effects. An exemplary BGMOSFET offers similar electrical performance of a MOSFET but with an advantage of having two independent gates to control current flow through a common semi-conductive channel region.

One exemplary embodiment of the invention describes a design/layout of an innovative device, a BGMOSFET, providing a dual gate control (one MOSFET gate and one buried JFET gate) of a common or dual semi-conductive channel region integrated into a monolithic structure (structure integrates improved elements and functions of a MOSFET and a JFET). An exemplary BGMOSFET employs two independent gates (one MOSFET gate and one buried JFET gate) to control current flow between an exemplary drain and source making exemplary BGMOSFET suitable for RF type applications and providing enhanced TID performance. An embodiment includes an exemplary fabrication steps (design/layout) of an exemplary BGMOSFET. An exemplary BGMOSFET structure can be designed and fabricated to withstand voltages of a few volts to voltages that exceed tens of volts by using different substrates (e.g., doping of the substrate material). A current density of an exemplary BGMOSFET structure can be increased by creating an array of BGMOSFET structures placed in parallel. A monolithic solution lowers costs, size, and weight and increases overall reliability important factors in strategic and space systems.

An exemplary embodiment can be fabricated using silicon (Si) and silicon dioxide (SiO2) but other semiconductor materials such as silicon carbide (SiC) or gallium arsenide (GaAs) can be used instead of silicon for, e.g., substrate and doped implants/diffusions and other dielectric materials such as silicon nitride (SiN), aluminum oxide (Al2O3), and hafnium oxide (HfO2) can be used instead of SiO2 for, e.g., gate oxide. Use of other semiconductor materials and gate dielectric materials affects material properties (e.g, thermal conductivity, capacitance, carrier lifetime, etc.) yielding different performance characteristics.

Figure 22:
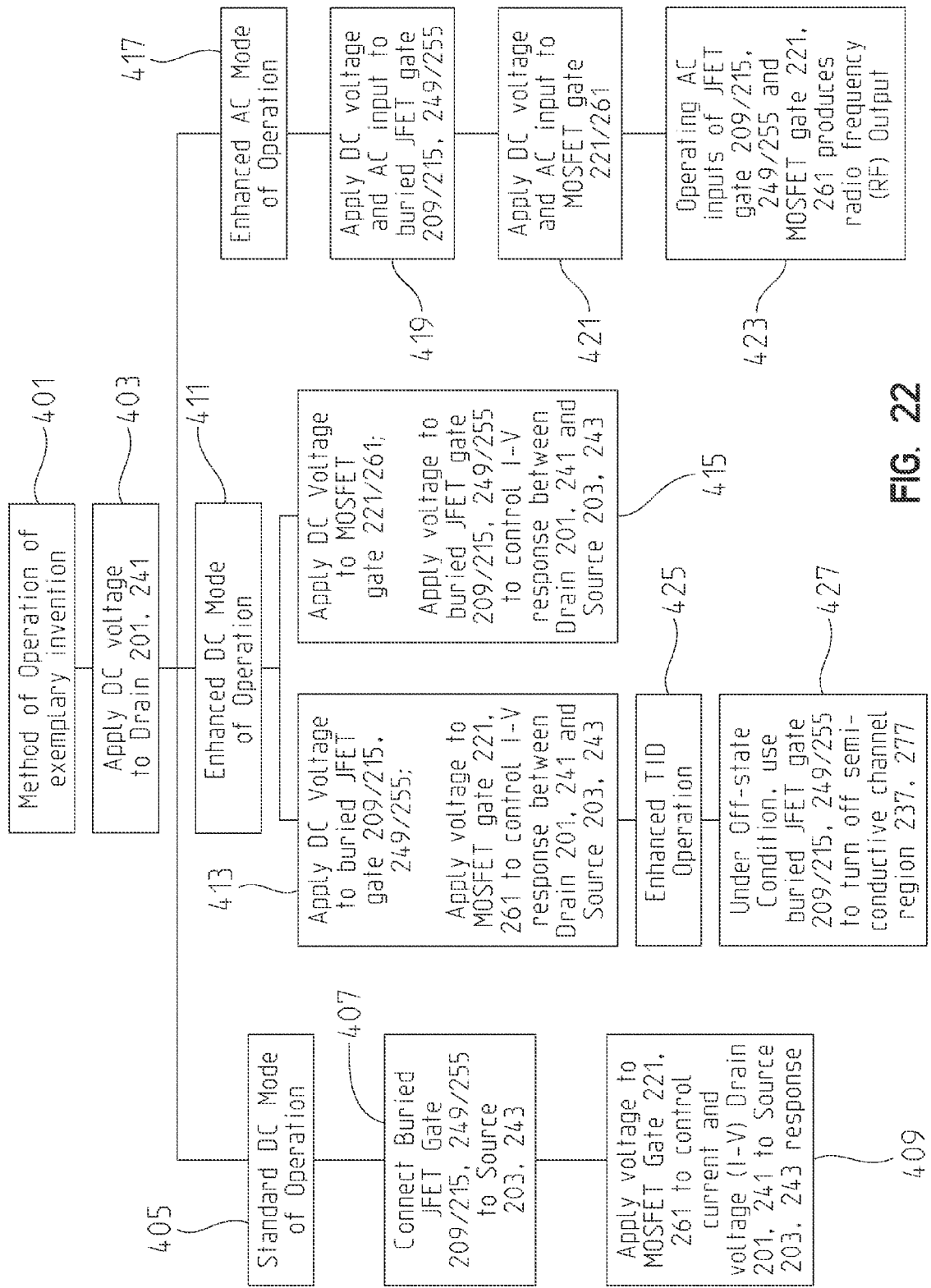
FIG. 22 shows an exemplary method of operation of exemplary embodiments of the invention comprising various modes of operation.

FIG. 22 shows exemplary methods of operation 401 of exemplary embodiments of the invention. These methods of operation can be triggered based on determinations that operation of one or more functionalities of an exemplary embodiment of the invention is needed such as, for example, detecting a condition to alter operation of exemplary semi-conductive channel region from MOSFET gate control to buried JFET gate control in response to an electromagnetic interference event. Another determination for need to operate exemplary functionality is determining additional or different current or voltage control operations are desirable such as in RF system operation such as described above. Once a determination of a need for operation has been determined, operation of an exemplary embodiment of the invention can commence such as, for example, at step 405, a standard DC mode of operation can be initiated comprising providing an exemplary embodiment of the invention such as described above; at step 407, shorting a buried JFET gate 209/215, 249/255 to a source 203, 243; at step 403, applying DC voltage to a drain 201, 241; at step 409, applying a voltage to a MOSFET gate 221, 261 to control current/voltage output. A second mode can comprise initiating an Enhanced DC Mode of Operation using a design such as described herein/above at step 411; at step 403, apply a DC voltage to a drain 201, 241; and steps 413/415 can be executed concurrently or separately to control current/voltage output between drain 201, 241 and source 203, 243 by applying a voltage to buried JFET gate 209/215, 249/255, a voltage to MOSFET gate 221, 261, or a voltage to both to control current/voltage output. Under MOSFET gate control, another mode can comprise initiating an Enhanced TID mode of operation using a design such as described herein/above at step 425 and at step 427, to alter operational control of the semi-conductive channel region 237, 277 from MOSFET gate control to buried JFET gate control. Another mode can comprise initiating an Enhanced AC Mode of operation in accordance with an exemplary embodiment of the invention using a design such as described herein/above at step 417; at step 403, applying DC voltage to drain 201, 241; at step 419, applying DC voltage and AC input to buried JFET gate 209/215, 249/255; at step 421, applying DC voltage and AC input to MOS gate 221, 261; and at step 423, producing an output by applying AC input to buried JFET gate 209/215, 249/255, by applying AC input to MOSFET gate 221, 261, or by applying AC inputs to both.

Figure 23A:
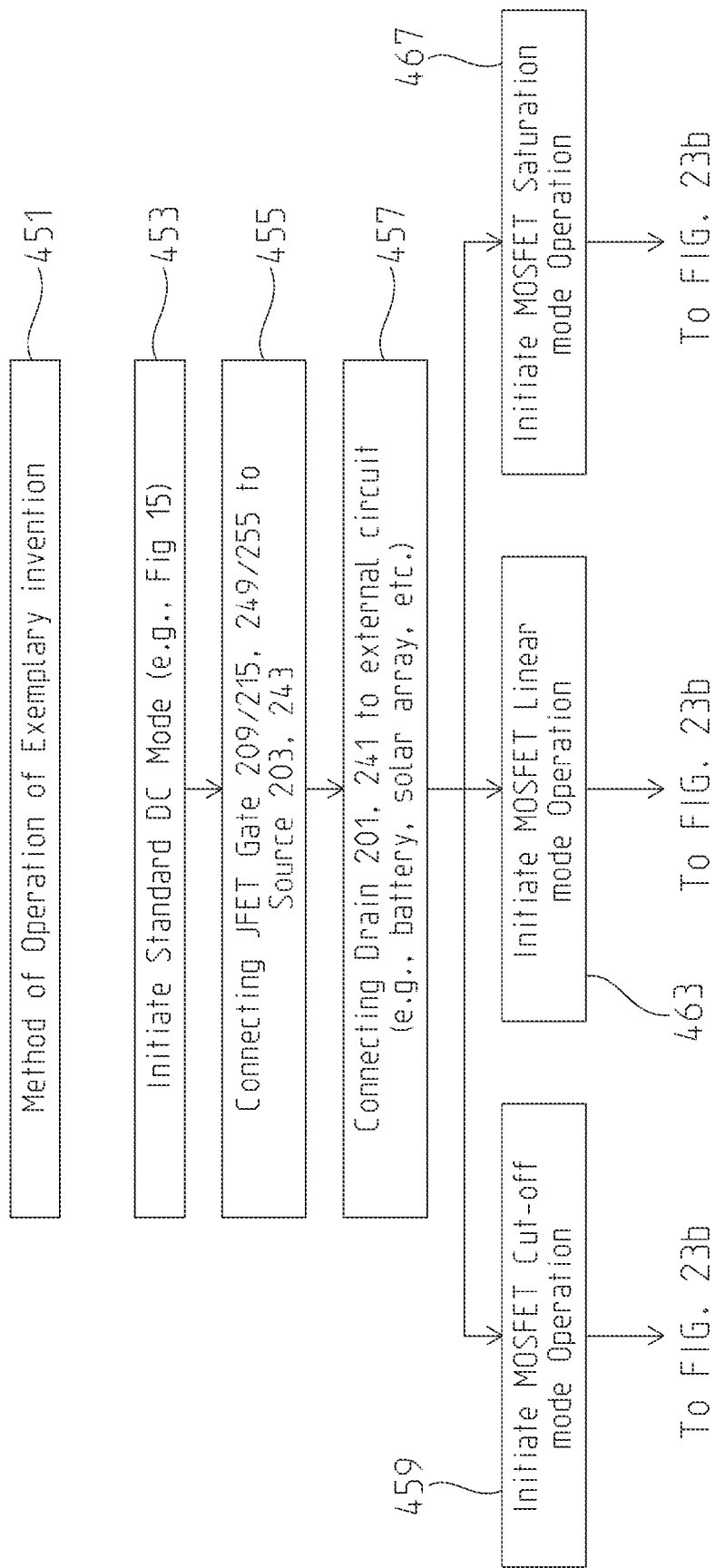
Figure 23C:
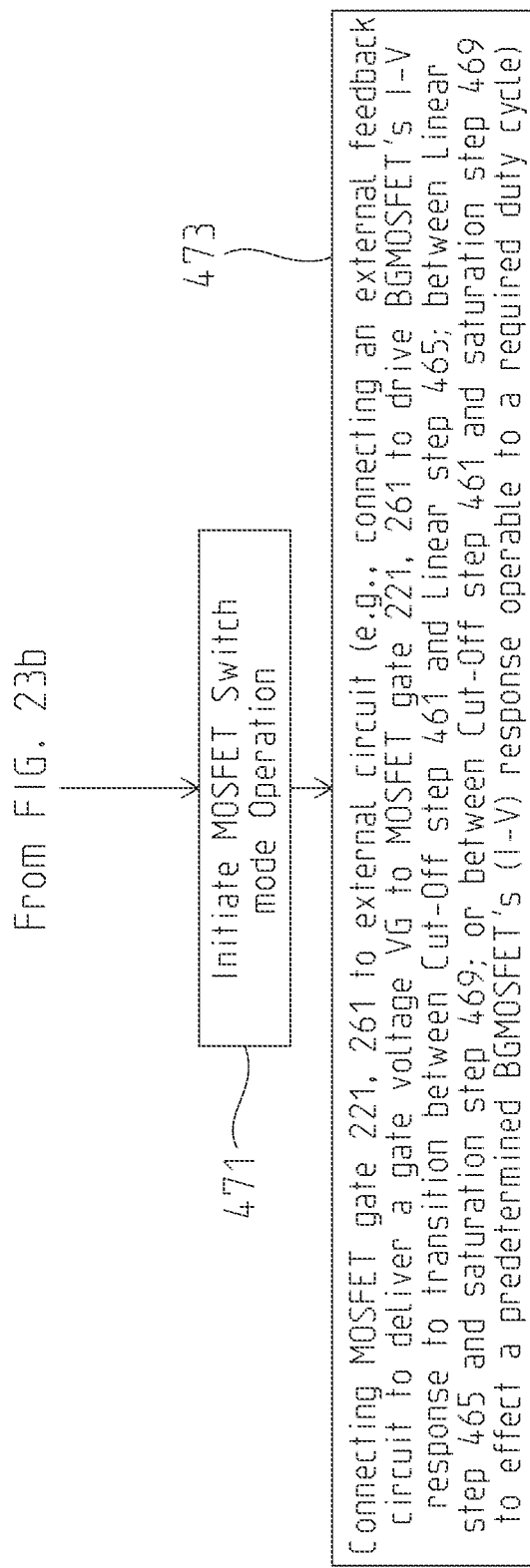

FIGS. 23A-23C show another exemplary method of operation 451 in accordance with another embodiment of the invention. A process begins by initiating standard DC mode operation step 453; by connecting buried JFET gate 209/215, 249/255 to source 203, 243 step 455; and by connecting drain 201, 241 to an external circuit (e.g., power supply) step 457. The next step is a determination depending upon system requirements of how to configure exemplary functionality such as whether to initiate MOSFET cut-off mode operation step 459; whether to initiate MOSFET linear mode operation step 463; whether to initiate MOSFET saturation mode operation step 467; or whether to initiate Switch mode operation step 471. MOSFET cut-off mode step 459 is initiated at step 461 by connecting MOSFET gate 221, 261 to an external circuit that delivers a gate voltage to MOSFET gate 221, 261 up to a voltage less than the MOSFET's threshold voltage Vth (MOS) to effect a reduction or elimination of exemplary BGMOSFET current flow through MOSFET's semi-conductive channel region 237, 277. MOSFET linear mode step 463 is initiated at step 465 by connecting MOSFET gate 221, 261 to an external circuit that delivers a gate voltage to MOS gate 221, 261 that is greater than the MOSFET's threshold voltage Vth (MOS) to effect and to modulate a resistive current-voltage (I-V) response through MOSFET's semi-conductive channel region 237, 277. To operate in linear mode step 465, drain voltage VD must be less than the difference of gate voltage VG and gate threshold voltage Vth (MOS) (e.g., VD<VG–Vth (MOS)). MOSFET saturation mode step 467 is initiated at step 469 by connecting MOSFET gate 221, 261 to an external circuit that delivers a gate voltage to MOSFET gate 221, 261 that is greater than MOSFET's gate threshold voltage Vth (MOS) to effect and to modulate a saturated current-voltage (I-V) response through MOSFET's semi-conductive channel region 237, 277. To operate in saturation mode step 469, drain voltage VD must be greater than the difference of gate voltage VG and gate threshold voltage Vth (MOS) (e.g., VD>VG–Vth (MOS)). Switch mode operation step 471 is initiated at step 473 by connecting MOSFET gate 221, 261 to an external circuit to deliver a gate voltage VG to MOSFET gate 221, 261 to alternate exemplary BGMOSFET's I-V response between cut-off step 461 and linear step 465; between linear step 465 and saturation step 469; or between cut-off step 461 and saturation step 469 to effect a predetermined exemplary BGMOSFET's (I-V) response operable to a duty cycle to effect a predetermined I-V response.

Figure 24:
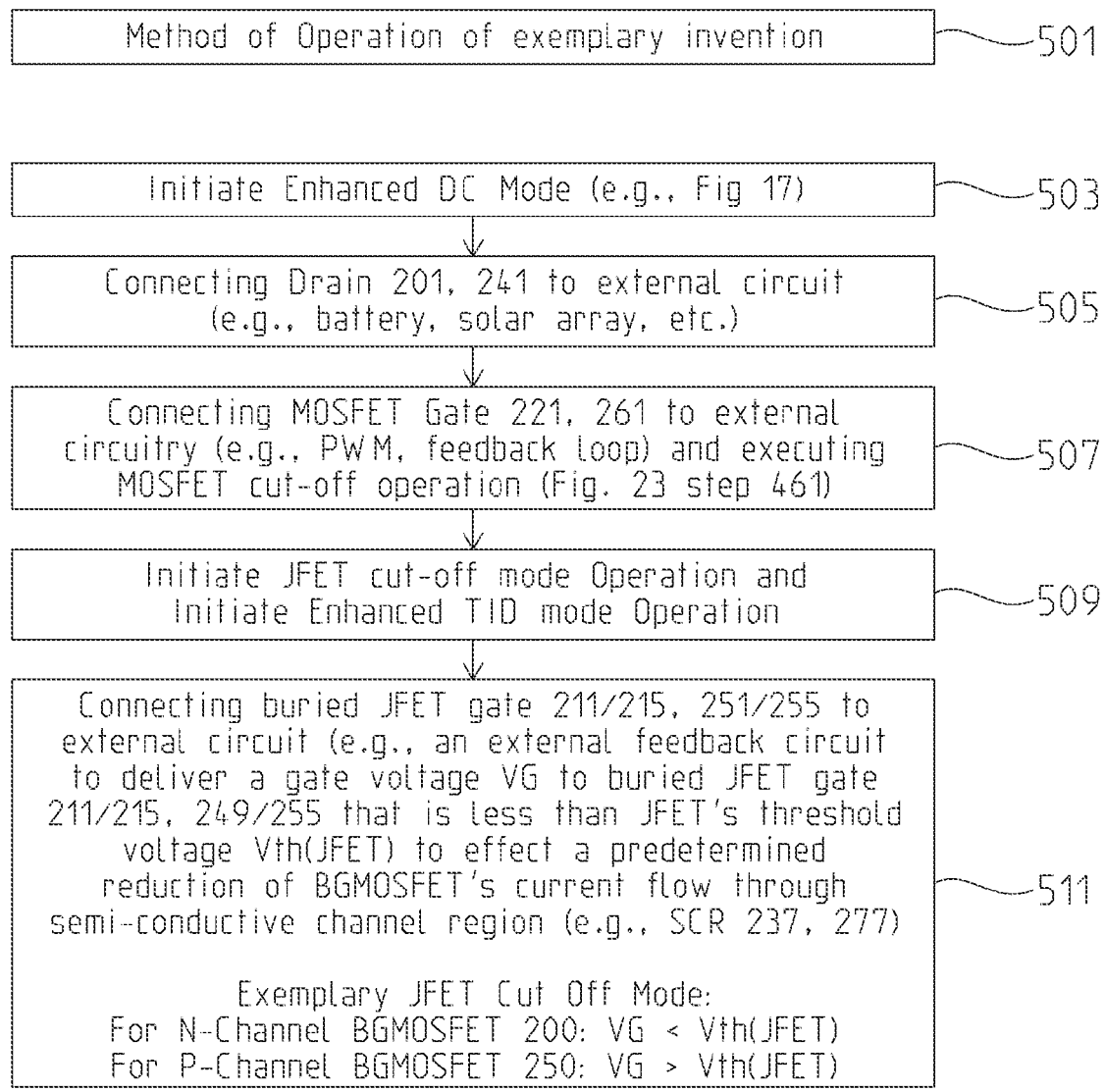
FIG. 24 shows an exemplary method of operation of an exemplary embodiment of the invention comprising another mode of operation.

FIG. 24 shows another exemplary method of operation 501 in accordance with another embodiment of the invention. Again, a process begins by initiating enhanced DC mode step 503; by connecting drain 201, 241 to an external circuit (e.g., power supply) step 505; and by connecting the MOSFET gate 221, 261 to an external circuit executing cut-off mode step 507. The next step is a determination depending upon system requirements (e.g., radiation detector) to initiate Enhanced TID mode operation (e.g., initiate JFET cut-off mode operation) step 509. Enhanced TID mode operation step 509 is initiated at step 511 by connecting buried JFET gate 211/215, 249/255 to an external circuit that delivers a gate voltage to buried JFET gate 211/215, 249/255 that is less than JFET's threshold voltage Vth (JFET) to effect a reduction or elimination of BGMOSFET current flow by altering operational control of semi-conductive channel region 237, 277 from MOSFET gate control to buried JFET gate control.

Figure 25A:
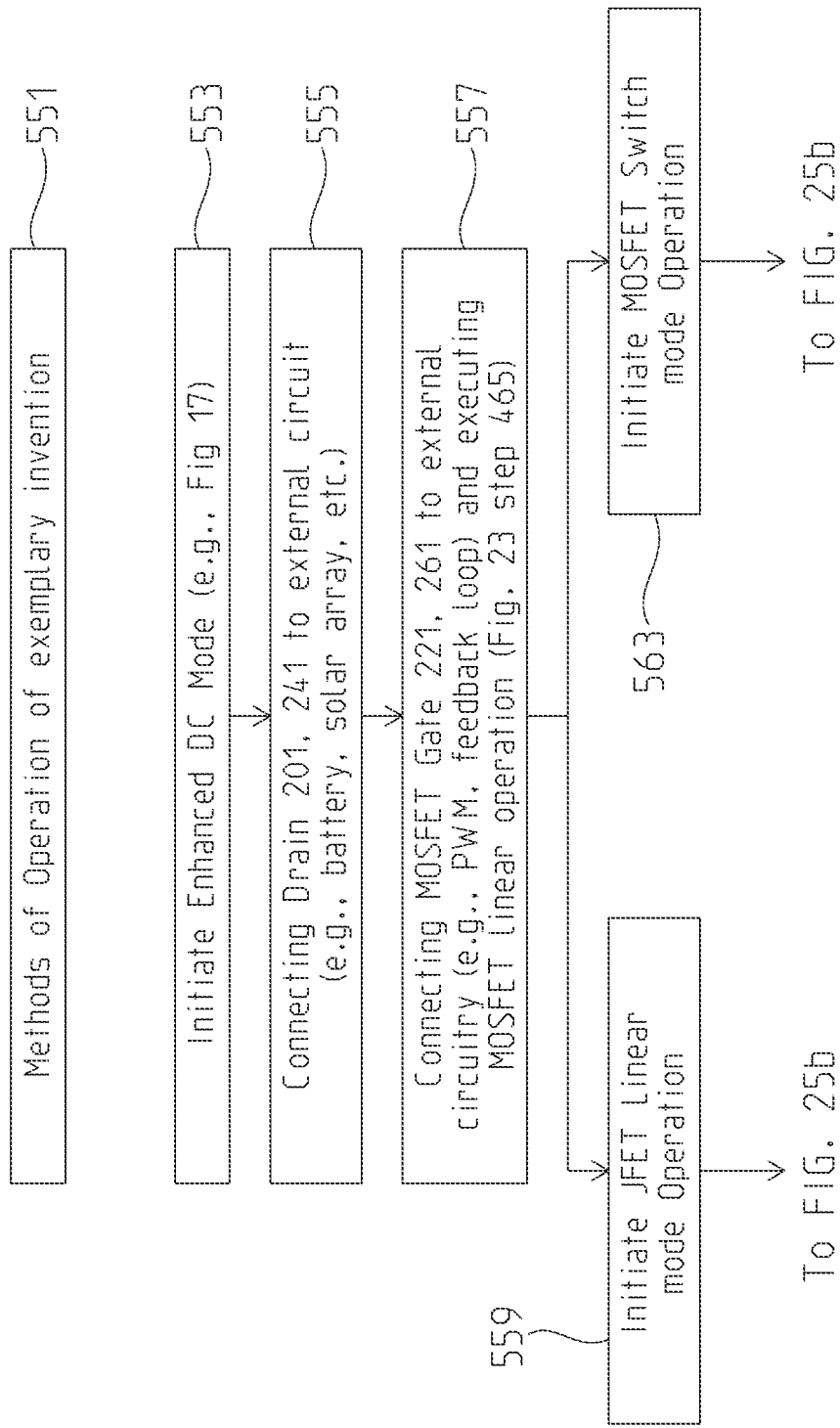

FIGS. 25A and 25B show another exemplary method of operation 551 in accordance with another embodiment of the invention. Again, a process begins by initiating enhanced DC mode step 553; by connecting drain 201, 241 to an external circuit (e.g., power supply) step 555; and by connecting the MOSFET gate 221, 261 to an external circuit executing MOSFET linear mode operation step 557 (e.g., FIG. 23, step 465). The next step is a determination depending upon system requirements of how to configure exemplary functionality such as whether to initiate JFET linear mode operation step 559 or to initiate MOSFET switch mode operation step 563. JFET linear mode operation step 559 is initiated at step 561 by connecting buried JFET gate 209/215, 249/255 to an external circuit that delivers a gate voltage to buried JFET gate 209/215, 249/255 that is greater than the JFET's threshold voltage Vth (JFET) to determine conditions and to alter BGMOSFET's resistive current-voltage (I-V) response through a semi-conductive channel region 237, 277. At this step, another determination depending upon system requirements (e.g., linear regulator) can be made to initiate JFET switch mode operation step 571. JFET switch mode operation step 571 is initiated at step 573 by connecting buried JFET gate 209/215, 249, 255 to an external circuit to deliver a gate voltage VG to buried JFET gate 209/215, 249/255 to alternate BGMOSFET's I-V response between cut-off mode operation step 511 (FIG. 24) and linear mode operation step 561 to effect a predetermined BGMOSFET's (I-V) response operable to a duty cycle to effect a predetermined I-V response. MOSFET switch mode operation step 563 is initiated at step 565 by connecting MOSFET gate 221, 261 to an external circuit to deliver a gate voltage VG to MOSFET gate 221, 261 to alternate exemplary BGMOSFET's I-V response between MOSFET cut-off mode operation step 461 (FIG. 23) and MOSFET linear mode operation step 465 (FIG. 23) to effect a predetermined exemplary BGMOSFET's (I-V) response operable to a duty cycle to effect a predetermined I-V response. Another determination depending upon system requirements (e.g., radiation detector) can be made to initiate enhanced TID mode operation step 567. Enhanced TID mode operation step 567 is initiated at step 569 by connecting buried JFET gate 209/215, 249, 255 to an external circuit to deliver a gate voltage VG to buried JFET gate 209/215, 249/255 to alternate exemplary BGMOSFET's I-V response between JFET cut-off mode operation step 511 (FIG. 24) and JFET linear mode operation step 561 to effect a predetermined exemplary BGMOSFET's (I-V) response operable to a duty cycle to effect a predetermined I-V response.

Figure 26A:
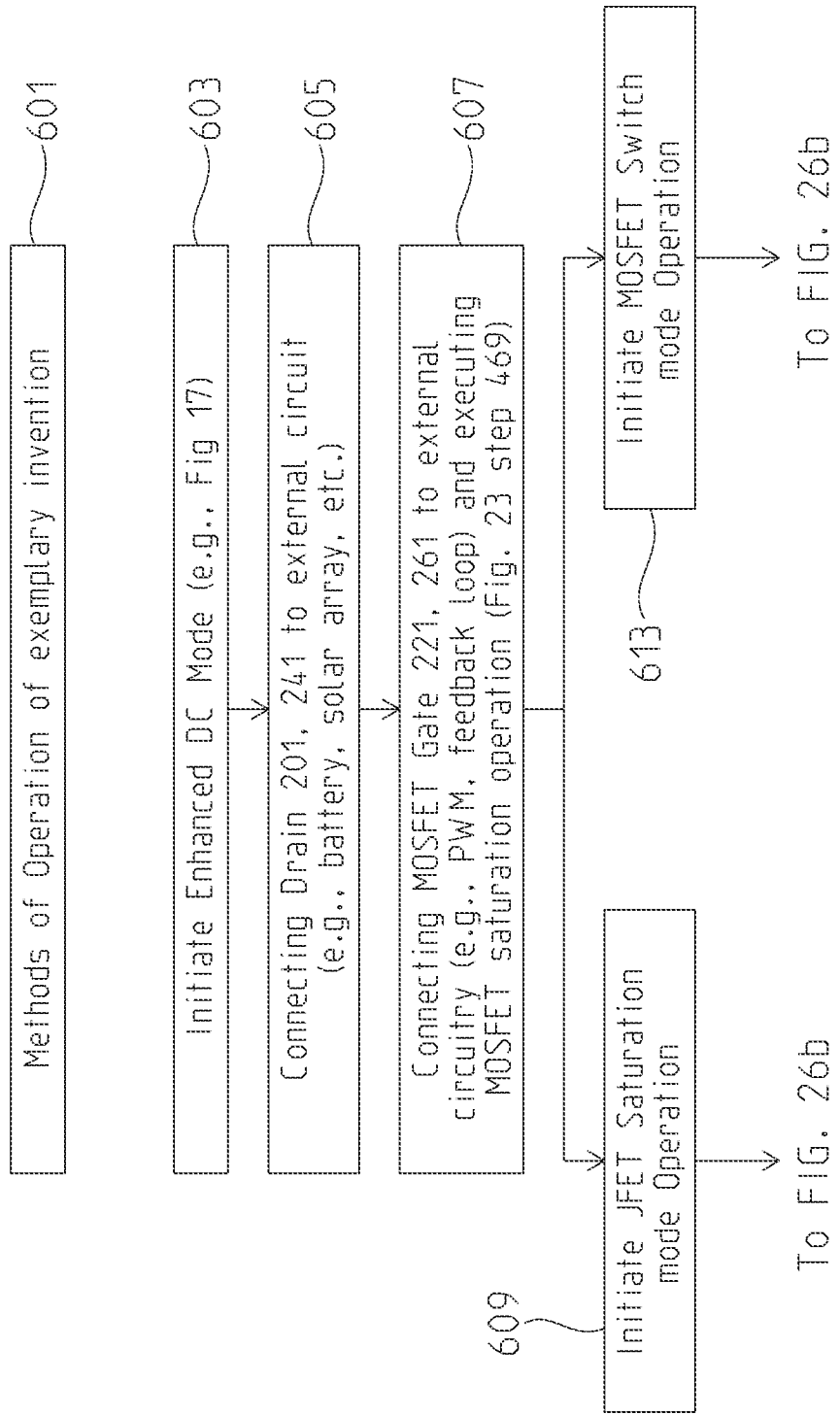
FIGS. 26A and 26B show an exemplary method of operation of an exemplary embodiment of the invention comprising another mode of operation.
Figure 26B:
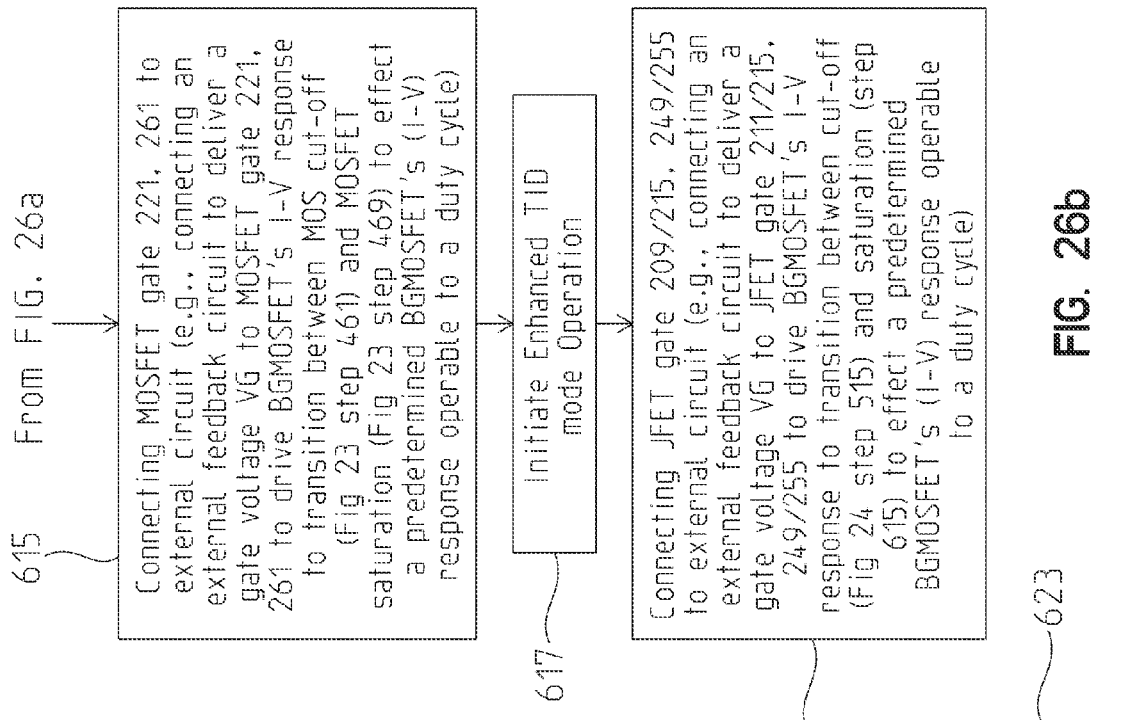

FIGS. 26A and 26B show another exemplary method of operation 601 in accordance with another embodiment of the invention. Again, a process begins by initiating enhanced DC mode step 603; by connecting drain 201, 241 to an external circuit (e.g., power supply) step 605; and by connecting the MOSFET gate 221, 261 to an external circuit executing MOSFET saturation mode operation step 607 (e.g., FIG. 23, step 469). The next step is a determination depending upon system requirements of how to configure exemplary functionality such as whether to initiate JFET saturation mode operation step 609 or to initiate MOSFET switch mode operation 613. JFET saturation mode operation step 609 is initiated at step 611 by connecting buried JFET gate 209/215, 249/255 to an external circuit that delivers a gate voltage to buried JFET gate 209/215, 249/255 that is greater than the JFET's threshold voltage Vth (JFET) to determine conditions and to alter exemplary BGMOSFET's saturated current-voltage (I-V) response through a semi-conductive channel region 237, 277. Another determination depending upon system requirements (e.g., switching regulator) can be made to initiate JFET switch mode operation step 621. JFET switch mode operation step 621 is initiated at step 623 by connecting buried JFET gate 209/215, 249, 255 to an external circuit to deliver a gate voltage VG to buried JFET gate 209/215, 249/255 to alternate exemplary BGMOSFET's I-V response between JFET cut-off mode operation step 511 (FIG. 24) and JFET saturation mode operation step 611 to effect a predetermined exemplary BGMOSFET's (I-V) response operable to a duty cycle to effect a predetermined I-V response. MOSFET switch mode operation step 613 is initiated at step 615 by connecting MOSFET gate 221, 261 to an external circuit to deliver a gate voltage VG to MOSFET gate 221, 261 to alternate exemplary BGMOSFET's I-V response between MOSFET cut-off mode operation step 461 (FIG. 23) and MOSFET saturation mode operation step 469 (FIG. 23) to effect a predetermined exemplary BGMOSFET's (I-V) response operable to a duty cycle to effect a predetermined I-V response. Another determination depending upon system requirements (e.g., radiation detector) can be made to initiate enhanced TID mode operation step 617. Enhanced TID mode operation step 617 is initiated at step 619 by connecting buried JFET gate 209/215, 249, 255 to an external circuit to deliver a gate voltage VG to buried JFET gate 209/215, 249/255 to alternate exemplary BGMOSFET's I-V response between JFET cut-off mode operation step 511 (FIG. 24) and JFET saturation mode operation step 611 to effect a predetermined exemplary BGMOSFET's (I-V) response operable to a duty cycle to effect a predetermined I-V response.

Figure 27A:
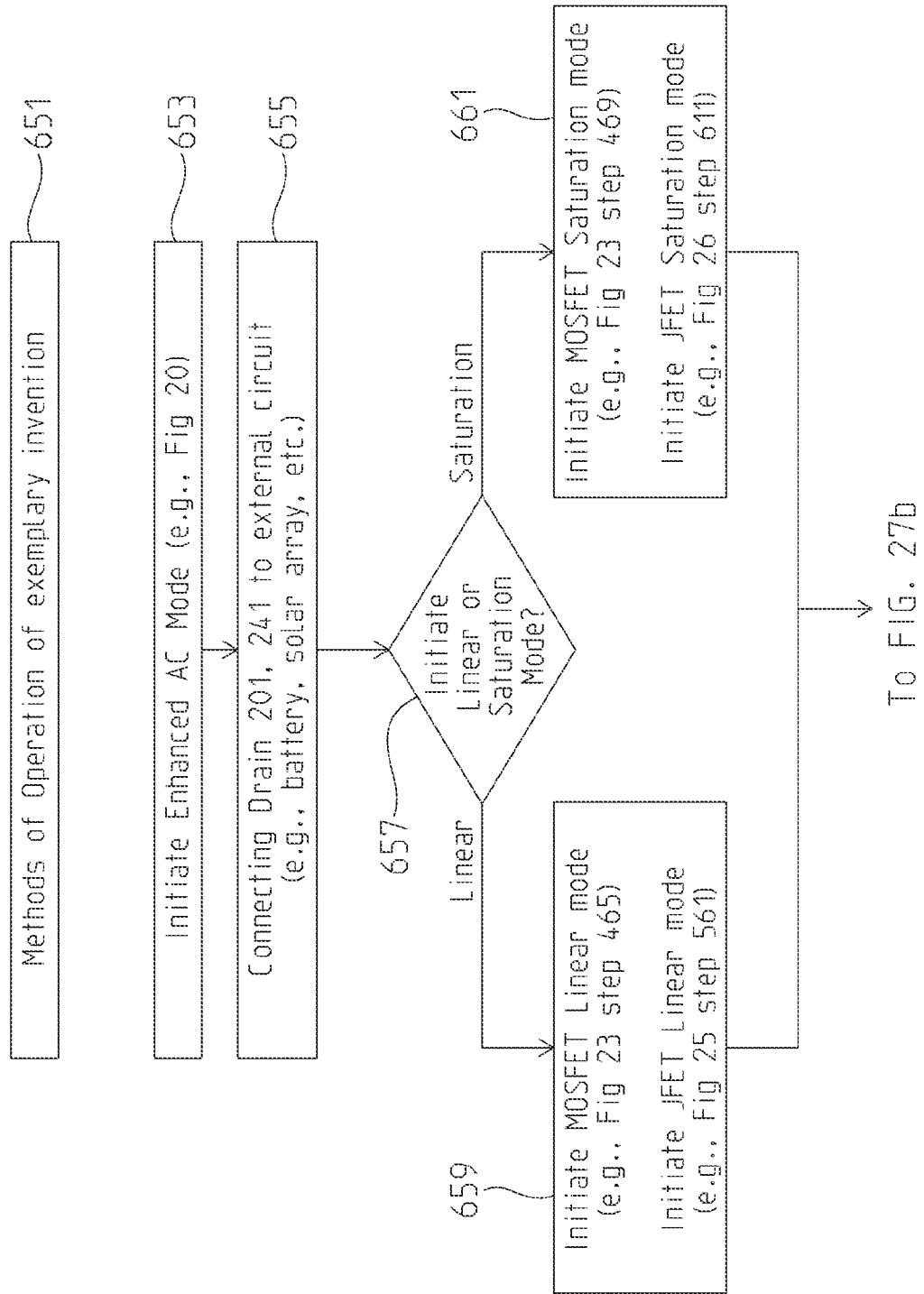
FIGS. 27A and 27B show an exemplary method of operation of an exemplary embodiment of the invention comprising another mode of operation.
Figure 27B:
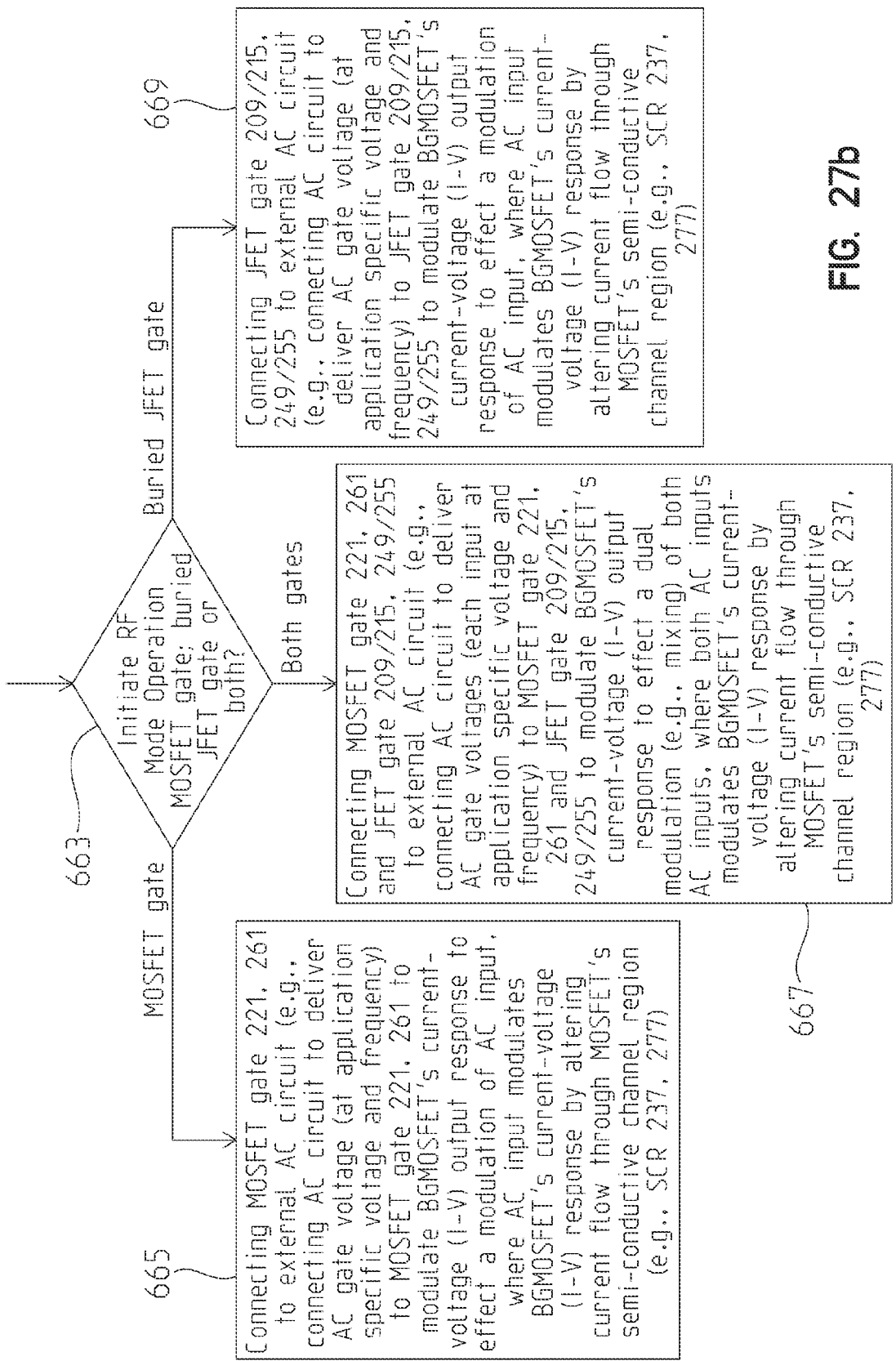

FIGS. 27A and 27B show another exemplary method of operation 651 in accordance with another embodiment of the invention. Again, a process begins by initiating enhanced AC mode operation step 853 by connecting the drain 201, 241 to an external circuit (e.g., power supply) step 655. The process continues by initiating MOSFET/JFET linear mode operation step 659 or MOSFET/JFET saturation mode operation step 661. Another process can be employed by initiating RF mode operation step 663 of MOSFET gate, buried JFET gate, or both. RF mode operation of MOSFET gate step 665 begins by connecting the MOSFET gate 221, 261 to an external AC circuit to deliver an AC voltage to MOSFET gate 221, 261 to modulate BGMOSFET's I-V response to effect a modulation of AC input into BGMOSFET's output response. RF mode operation of buried JFET gate step 669 begins by connecting the buried JFET gate 209/215, 249/255 to an external AC circuit to deliver an AC voltage to buried JFET gate 209/215, 249/255 to modulate BGMOSFET's I-V response to effect a modulation of AC input into exemplary BGMOSFET's output response. RF mode operation of both MOSFET gate and buried JFET gate step 667 begins by connecting MOSFET gate 221, 261 and buried JFET gate 209/215, 249/255 to external AC circuits to deliver AC voltages (in phase or out of phase) to each gate to modulate exemplary BGMOSFET output response.

Figure 28:
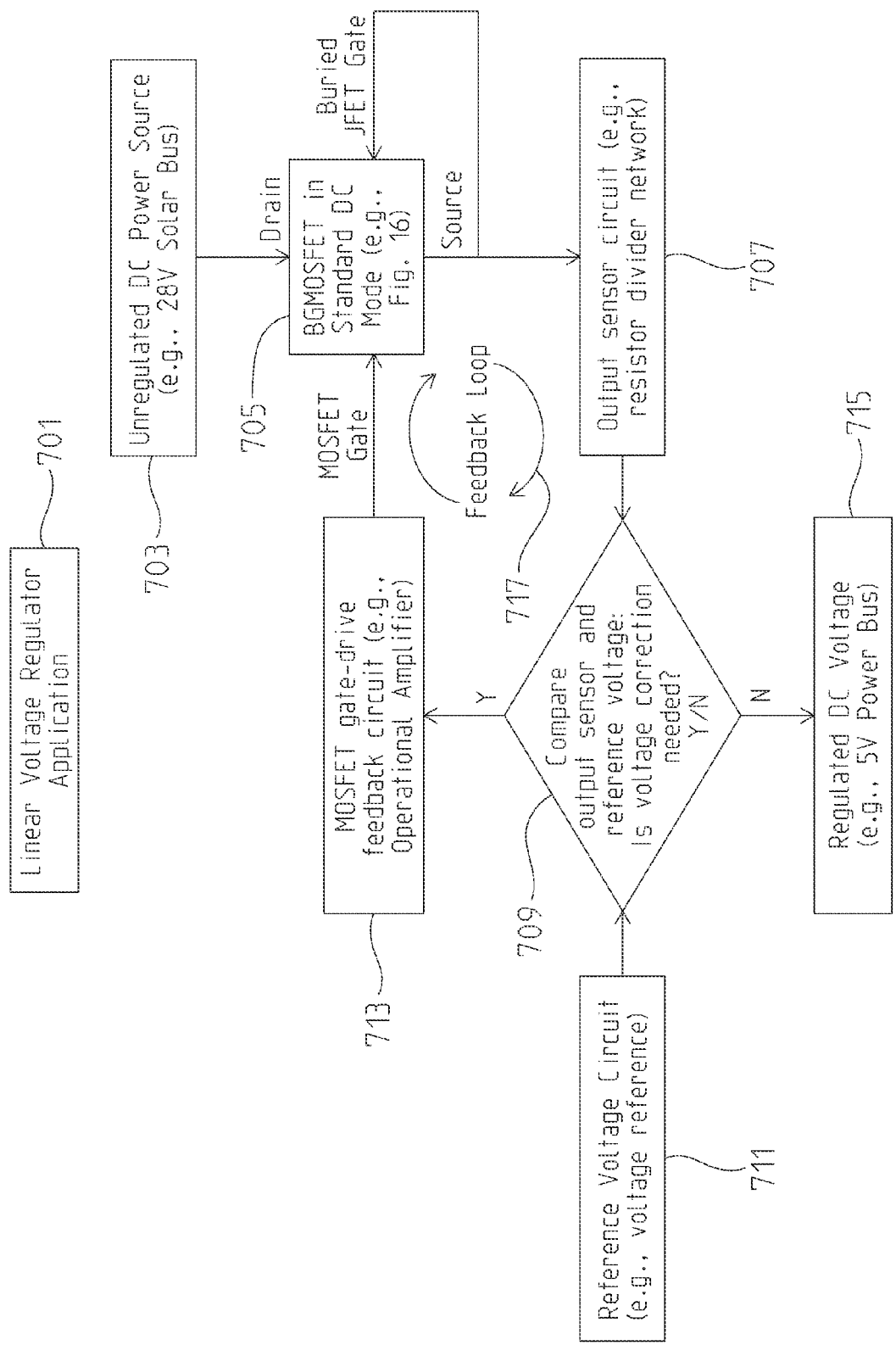
FIG. 28 shows an exemplary system type application (linear voltage regulator) of an exemplary BGMOSFET in accordance with one embodiment of the invention.

FIG. 28 shows a block diagram of an exemplary application (a linear voltage regulator 701) where an exemplary BGMOSFET 705 is connected to an unregulated DC power source 703 (e.g., 28 volt solar bus). The exemplary buried JFET gate 209/215, 249/255 is connected to source 203, 243. The source 203, 243 is connected to an output sensing circuit 707 (e.g., a resistor divider network). The sensing network 707 provides an input to an external comparator 709 with another reference voltage input 711. If regulated DC output voltage 715 is lower or higher than required regulated output voltage, feedback amplifier 713 provides corrective signal to adjust MOSFET gate voltage (feedback loop 717) until expected output voltage is achieved.

Figure 29:
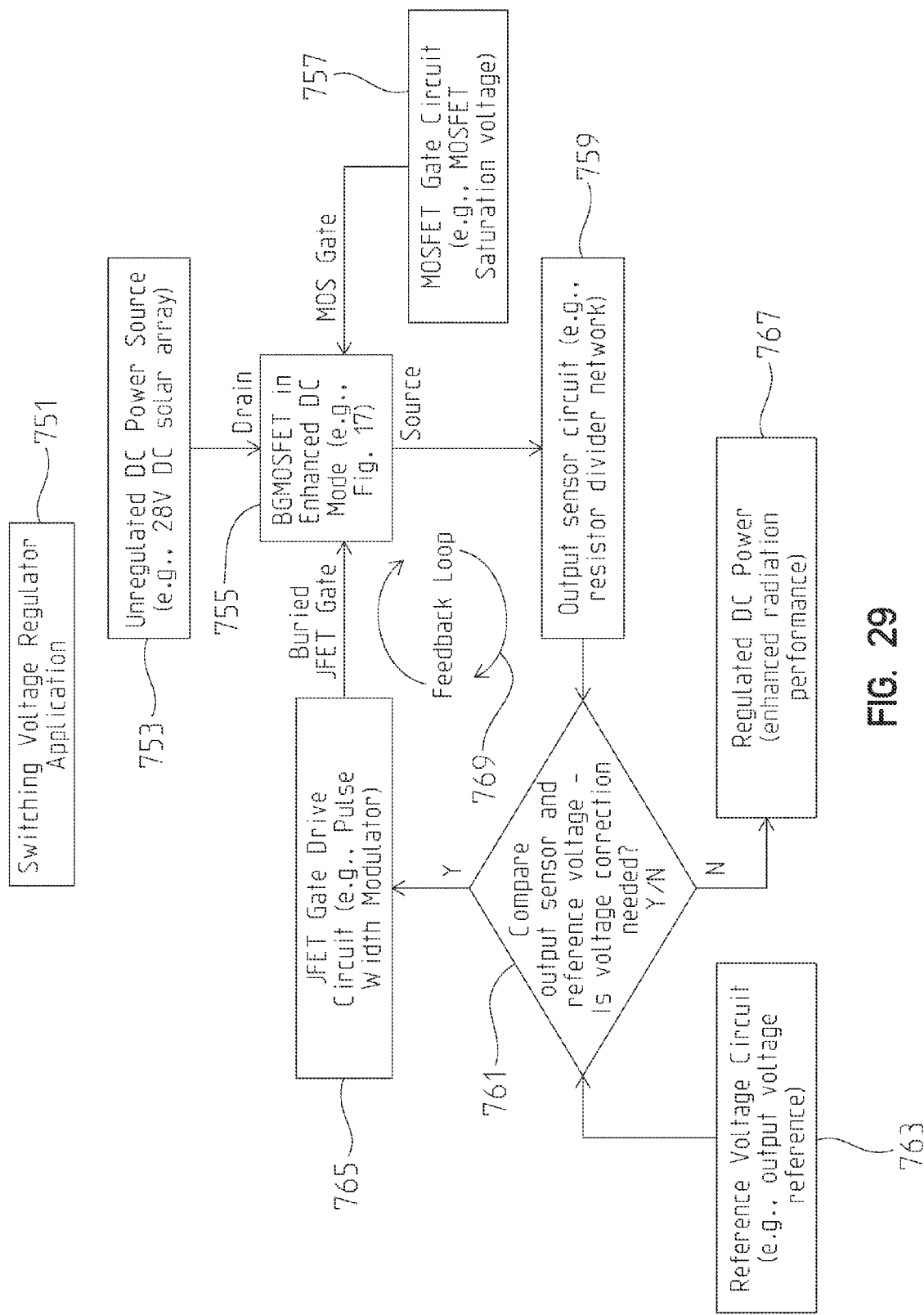
FIG. 29 shows an exemplary system type application (switching voltage regulator) of an exemplary BGMOSFET in accordance with one embodiment of the invention.

FIG. 29 shows a block diagram of an exemplary application (a switching voltage regulator 751) where an exemplary BGMOSFET 755 is connected to an unregulated DC power source 933 (e.g., 28 volt solar array). The exemplary MOSFET gate 221, 261 is connected to a MOSFET gate circuit 757 where MOSFET gate 221, 261 is configured to operate in saturation mode. The source 203, 243 is connected to an output sensing circuit 759 (e.g., a resistor divider network). The sensing network 759 provides an input to an error feedback amplifier 761 with another reference voltage 763 input. If regulated DC output voltage 767 is lower or higher than required regulated output voltage, the error feedback amplifier 761 adjusts the JFET gate drive circuit 765 (e.g., pulse width modulator) to determine and to alter a duty cycle driving the buried JFET gate in switch mode operation (feedback loop 769) until the required regulated output voltage is achieved.

Figure 30:
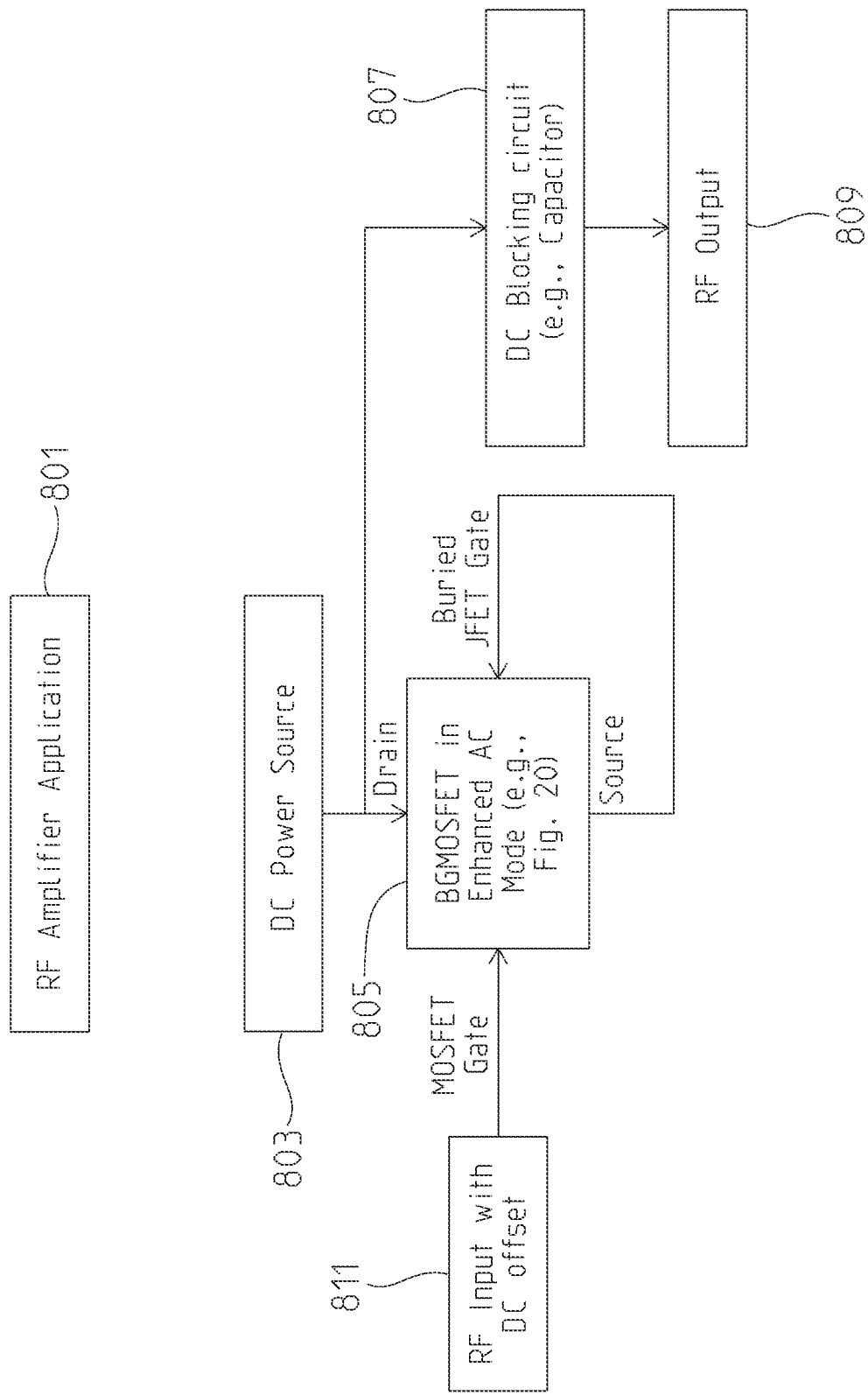
FIG. 30 shows an exemplary system type application (RF amplifier) of an exemplary BGMOSFET in accordance with one embodiment of the invention.

FIG. 30 shows a block diagram of an exemplary application (RF amplifier 801) where an exemplary BGMOSFET 805 is connected to DC power source 803 (e.g., regulated voltage source). The exemplary buried JFET gate 209/215, 249/255 is connected to source 203, 243. The exemplary MOSFET gate 221, 261 is connected to RF input with a DC offset circuit 811 where MOSFET gate 221, 261 is configured in MOSFET linear AC mode operation. The drain 201, 241 is connected to a DC blocking circuit 807 (e.g., capacitor), where DC blocking circuit 807 separates DC voltage 803 from modulated RF output 809 signal.

Figure 31:
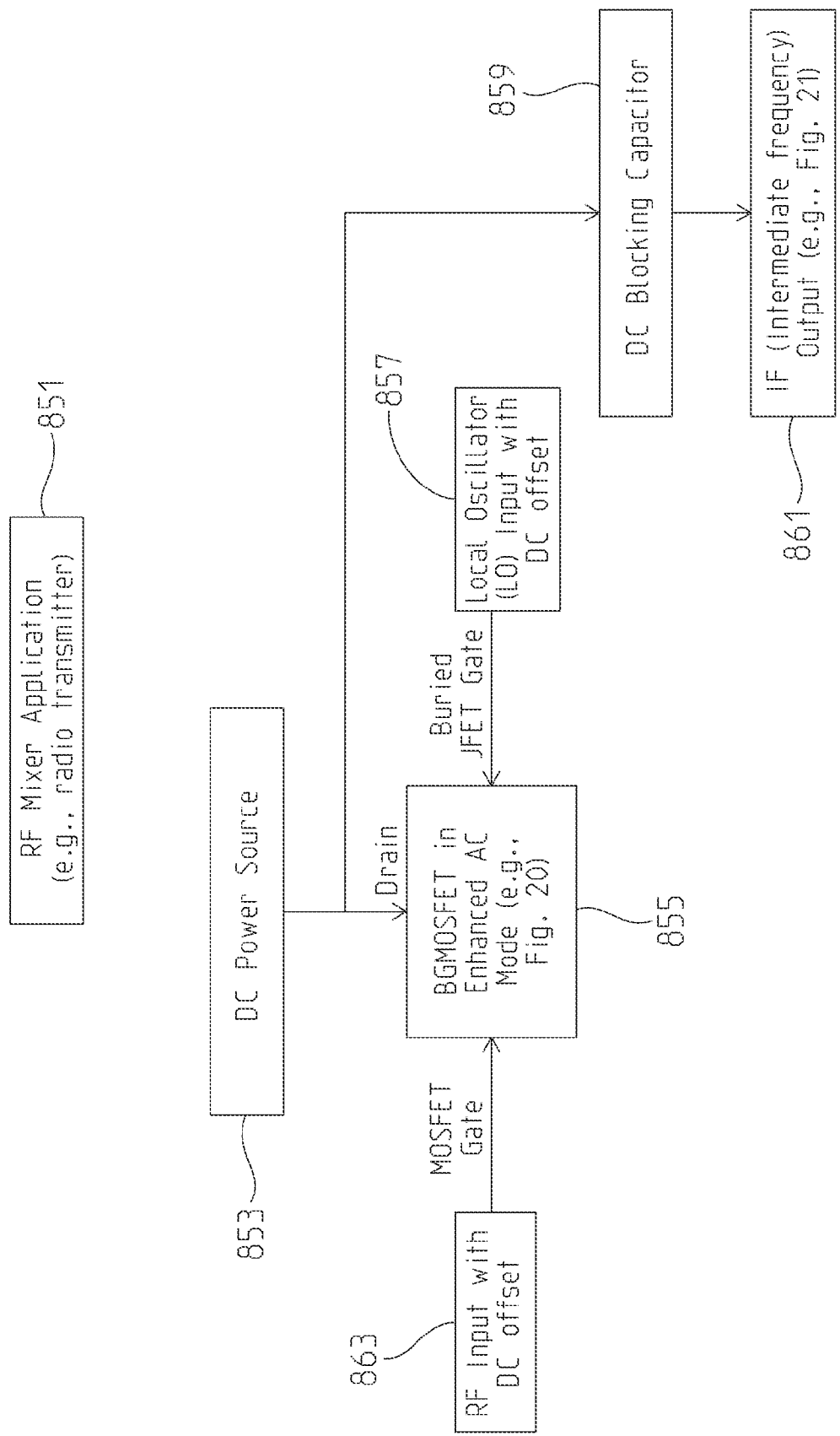
FIG. 31 shows an exemplary system type application (RF Mixer) of an exemplary BGMOSFET in accordance with one embodiment of the invention.

FIG. 31 shows a block diagram of an exemplary application (RF mixer 851) where an exemplary BGMOSFET 855 is connected to DC power source 853 (e.g., regulated voltage). The exemplary buried JFET gate 209/215, 249/255 is connected to local oscillator (LO) with DC offset circuit 857, where JFET gate 209/215, 249/255 is configured in JFET linear mode operation. The exemplary MOSFET gate 221, 261 is connected to RF input with DC offset circuit 863, where MOSFET gate 221, 261 is configured in MOSFET linear mode operation. The drain 201, 241 is connected to DC blocking circuit 859 (e.g., DC blocking capacitor), where DC blocking circuit 859 separates DC voltage 853 from modulated RF output 861 signal.

Although the invention has been described in detail with reference to certain preferred embodiments, variations and modifications exist within the spirit and scope of the invention as described and defined in the following claims.

The invention claimed is:

1. An electrical system comprising:
   a metal oxide semi-conductor (MOS) field effect transistor (MOSFET) section disposed in a first substrate section, said MOSFET section comprising a MOSFET control gate, a source region, a drain region, and a semi-conductive channel region within a gate insulator region, said semi-conductive channel region formed between said source region and said drain region, said MOSFET control gate is disposed in proximity with and partially overlapping one side of said source region and one side of said drain region, said MOSFET gate is further disposed on a first side of said semi-conductive channel region; and
   a monolithic junction field effect transistor (JFET) section disposed on a second side of said gate insulator region that faces away from said MOSFET control gate, said JFET section comprises an opposite dopant of said semi-conductive channel region, said JFET section is further formed comprising a doped region that is not in physical contact with either said source or said drain region and is positioned at a first distance from said MOSFET control gate, said first distance is determined based on a required distance that an electromagnetic field generated by said JFET must travel to pass through said semi-conductive channel region;

wherein said JFET section is disposed perpendicularly to said MOSFET on one side of said MOSFET.

2. An electrical system as in claim 1, further comprising a control system for determining when said JFET and said MOSFET sections are to be operated comprising an automated system including sensors as well as a control section, wherein said automated system can include radiation sensors.

3. An electrical system as in claim 2, wherein said control system can comprise a radio frequency transmitter or receiver system.

4. The electrical system as in claim 1, further comprising a plurality of alternating current (AC) voltage sources each one coupled to said MOSFET section and said JFET section.

5. An electrical system as in claim 2, further comprising a control system operable to modulate said plurality of alternating-current (AC) voltage sources to generate a radio-frequency response output from said MOSFET and JFET sections.

6. An electrical system as in claim 1, further comprising a plurality of direct-current (DC) voltage sources that are each coupled to an input gate of said MOSFET and JFET sections.

7. An electrical system as in claim 1, further comprising a direct-current (DC) voltage source that is coupled to an input gate of said MOSFET section wherein an input gate of said JFET is coupled to a source for said MOSFET section coupled to a common drain for said MOSFET section.

8. An electrical system comprising:
a metal oxide semiconductor (MOS) field effect transistor (MOSFET) section formed with a control gate having a first side, a source region, a drain region, and a first semi-conductive channel region (SCR) formed with a first SCR side and an opposing second SCR side, wherein said first SCR is formed having opposing ends abutting and between said source region and said drain region, said first SCR's first side is formed facing and in proximity with said control gate first side on a first side of said MOSFET; and
a junction field effect transistor (JFET) having a first side and comprising a first JFET gate contact region, a second JFET gate contact region, and a JFET semi-conductive channel region having an opposite semi-conductive function as said first SCR, wherein said JFET further defines a first JFET axis running between said first and second JFET gate contact regions, said JFET semi-conductive channel region is disposed overlapping a portion of and facing one side of said first and second JFET gate contact regions at opposing ends of said JFET semi-conductive channel region;
wherein said JFET semi-conductive channel region is formed so that said JFET first axis is perpendicular to said MOSFET's SCR such that operation of the JFET modulates or controls current passing through said SCR that is, absent operation of said JFET, controlled by an electrical path of said MOSFET's SCR.

9. An electrical system as in claim 8, further comprising a control system for determining when said JFET and said MOSFET is to be operated comprising an automated system including sensors as well as a control section, wherein said automated system can include radiation sensors as well as other control systems.

10. An electrical system as in claim 9, wherein said control system can comprise a radio-frequency transmitter or receiver system.

11. The electrical system as in claim 8, further comprising a plurality of alternating-current (AC) voltage sources each one coupled to said MOSFET section and said JFET section.

12. An electrical system as in claim 11, further comprising a control system operable to modulate said plurality of alternating-current (AC) voltage sources to generate a radio-frequency response output from said MOSFET and JFET sections.

13. An electrical system as in claim 8, further comprising a plurality of direct-current (DC) voltage sources that are each coupled to an input gate of said MOSFET section and said JFET section.

14. An electrical system as in claim 8, further comprising a direct-current (DC) voltage source that is coupled to an input gate of said MOSFET section wherein an input gate of said JFET is coupled to a source for said MOSFET section coupled to a common drain for said MOSFET section.

15. A method associated with an electrical system comprising:
providing an electrical system comprising a metal oxide semiconductor (MOS) field effect transistor (MOSFET) section formed with a control gate having a first side, a source region, a drain region, and a first semi-conductive channel region (SCR) formed with a first SCR side and an opposing second SCR side, wherein said first SCR is formed having opposing ends abutting and between said source region and said drain region, said first SCR's first side is formed facing and in proximity with said control gate first side on a first side of said MOSFET; and
a junction field effect transistor (JFET) having a first side and comprising a first JFET gate contact region, a second JFET gate contact region, and a JFET semi-conductive channel region having an opposite semi-conductive function as said first SCR, wherein said JFET further defines a first JFET axis running between said first and second JFET gate contact regions, said JFET semi-conductive channel region is disposed overlapping a portion of and facing one side of said first and second JFET gate contact regions at opposing ends of said JFET semi-conductive channel region;
wherein said JFET semi-conductive channel region is formed so that said JFET first axis is perpendicular to said MOSFET's SCR such that operation of the JFET modulates or controls current passing through said SCR that is, absent operation of said JFET, controlled by an electrical path of said MOSFET's SCR.

16. A method as in claim 15 further comprising operating said MOSFET in response to a control input to adjust, modulate, or cut-off said current passing through a semi-conductive channel region.

17. A method as in claim 16, wherein said operating comprises a MOSFET cut-off mode to halt passage of said electrical signals through said MOSFET section.

18. A method as in claim 16, wherein said operating comprises a MOSFET linear mode to alter resistive characteristics of at least a portion of said MOSFET section.

19. A method as in claim 16, wherein said operating comprises a MOSFET saturation mode to limit an amount of current that can pass through at least a portion of said MOSFET section.

20. A method as in claim 15, further comprising providing a control system for determining when said JFET and said MOSFET section are to be operated comprising an automated system including sensors as well as a control section, wherein said automated system can include radiation sensors.

21. A method as in claim 20, wherein said control systems can comprise a radio-frequency transmitter or receiver system.

22. A method as in claim 15, further comprising providing a plurality of alternating-current (AC) voltage sources each one coupled to said MOSFET section and said JFET section.

23. A method as in claim 15, further comprising providing a control system operable to modulate said plurality of alternating-current (AC) voltage sources to generate a radio-frequency response output from said MOSFET sections and JFET.

24. A method as in claim 15, further comprising providing a plurality of direct-current (DC) voltage sources that are each coupled to an input gate of said MOSFET section and said JFET section.

25. An electrical system as in claim 15, further comprising a direct-current (DC) voltage source that is coupled to an input gate of said MOSFET section wherein an input gate of said JFET is coupled to a source for said MOSFET section coupled to a common drain for said MOSFET section.

26. A method as in claim 16, further comprising
detecting a source of radiation or electromagnetic interference operable to affect operation of said MOSFET section; and
operating said JFET in response to said detecting said source of radiation or electromagnetic radiation to control passage of electrical signals through said MOSFET section to alter said MOSFET's response to said source.

27. A method associated with an electrical control system comprising:
providing a metal oxide semi-conductor (MOS) field effect transistor (MOSFET) section disposed in a first substrate section, said MOSFET section comprising a MOSFET control gate, a source region, a drain region, and a semi-conductive channel region within a gate insulator region, said semi-conductive channel region formed between said source region and said drain region, said MOSFET control gate is disposed in proximity with and partially overlapping one side of said source region and one side of said drain region, said MOSFET gate is further disposed on a first side of said semi-conductive channel region; and
providing a monolithic junction field effect transistor (JFET) section disposed on a second side of said gate insulator region that faces away from said MOSFET control gate, said JFET section comprises an opposite dopant of said semi-conductive region, said JFET section is further formed comprising a doped region that is not in physical contact with either said source or said drain region and is positioned at a first distance from said MOSFET control gate, said first distance is determined based on a required distance that an electromagnetic field generated by said JFET must travel to pass through said semi-conductive channel region;
wherein said JFET section is disposed perpendicularly to said MOSFET on one side of said MOSFET.

28. A method as in claim 27, further comprising
operating said JFET to control passage of electrical signals through said MOSFET section.

29. A method as in claim 27, further comprising
detecting a source of radiation or electromagnetic interference operable to affect operation of said MOSFET section; and
operating said JFET in response to said detecting said source of radiation or electromagnetic radiation to control passage of electrical signals through said MOSFET section to alter said MOSFET's response to said source.

30. A method as in claim 28, wherein said operating comprises a JFET cut-off mode to halt passage of said electrical signals through said MOSFET section.

31. A method as in claim 28, wherein said operating comprises a JFET linear mode to alter resistive characteristics of at least a portion of said MOSFET section.

32. A method as in claim 28, wherein said operating comprises a JFET saturation mode to limit an amount of current that can pass through at least a portion of said MOSFET section.

33. An electrical system comprising:
a metal oxide semi-conductor (MOS) field effect transistor (MOSFET) section disposed in a first substrate section, said MOSFET section comprising a MOSFET control gate, a source region, a drain region, and a semi-conductive channel region within a gate insulator region, said semi-conductive channel region formed between said source region and said drain region, said MOSFET control gate is disposed in proximity with and partially overlapping one side of said source region and one side of said drain region, said MOSFET gate is further disposed on a first side of said semi-conductive channel region;
a monolithic junction field effect transistor (JFET) section disposed on a second side of said gate insulator region that that faces away from said MOSFET control gate, said JFET section comprises an opposite dopant of said semi-conductive channel region, said JFET section is further formed comprising a doped region that is not in physical contact with either said source or said drain region and is positioned at a first distance from said MOSFET control gate, said first distance is determined based on a required distance that an electromagnetic field generated by said JFET must travel to pass through said semi-conductive channel region, wherein said JFET section is disposed perpendicularly to said MOSFET on one side of said MOSFET;
a control system for determining when said JFET and said MOSFET section are to be operated comprising an automated system including sensors for detecting an electromagnetic interference field as well as a control section; and
a plurality of electrical sources coupled to said MOSFET section and said JFET section.

34. The electrical system as in claim 33, wherein said automated system can include radiation sensors.

35. The electrical system as in claim 33, further comprising a control comprising a radio-frequency transmitter or receiver system operated by an output that is controlled or modulated by a combination of said MOSFET and said JFET.

36. The electrical system as in claim 33, wherein said plurality of electrical sources comprises a plurality of alternating-current (AC) voltage sources each one coupled to said MOSFET section and said JFET section.

37. The electrical system as in claim 36, further comprising a control system operable to modulate said plurality of electrical sources to generate a radio-frequency response output from said MOSFET section and said JFET section.

38. The electrical system as in claim 33, wherein said plurality of electrical sources comprises a plurality of direct-current (DC) voltage sources that are each coupled to an input gate of said MOSFET section and said JFET section.

39. An electrical system as in claim 33, wherein said plurality of electrical sources comprises a direct-current (DC) voltage source that is coupled to an input gate of said MOSFET section wherein an input gate of said JFET is coupled to a source of said MOSFET section coupled to a common drain for said MOSFET section.

40. An electrical system comprising:
a metal oxide semiconductor (MOS) field effect transistor (MOSFET) section formed with a control gate having a first side, a source region, a drain region, and a first semi-conductive channel region (SCR) formed with a first SCR side and an opposing second SCR side, wherein said first SCR is formed having opposing ends abutting and between said source region and said drain region, said first SCR's first side is formed facing and in proximity with said control gate first side on a first side of said MOSFET; and
a junction field effect transistor (JFET) having a first side and comprising a first JFET gate contact region, a second JFET gate contact region, and a JFET semi-conductive channel region having an opposite semi-conductive function as said first SCR, wherein said JFET further defines a first JFET axis running between said first and second JFET gate contact regions, said JFET semi-conductive channel region is disposed overlapping a portion of and facing one side of said first and second JFET gate contact regions at opposing ends of said JFET semi-conductive channel region;
wherein said JFET semi-conductive channel region is formed so that said JFET first axis is perpendicular to said MOSFET's SCR such that operation of the JFET modulates or controls current passing through said SCR that is, absent operation of said JFET, controlled by an electrical path of said MOSFET's SCR.

41. The electrical system as in claim 40, wherein said automated system can include radiation sensors.

42. The electrical system as in claim 40, further comprising a control comprising a radio-frequency transmitter or receiver system operated by an output that is controlled or modulated by a combination of said first MOSFET and said JFET.

43. The electrical system as in claim 40, wherein said plurality of electrical sources comprises a plurality of alternating-current (AC) voltage sources each one coupled to said MOSFET section and said JFET section.

44. The electrical system as in claim 43, further comprising a control system operable to modulate said plurality of electrical sources to generate a radio-frequency response output from said MOSFET sections and JFET.

45. The electrical system as in claim 40, wherein said plurality of electrical sources comprises a plurality of direct-current (DC) voltage sources that are each coupled to an input gate of said MOSFET section and said JFET section.

46. An electrical system as in claim 40, wherein said plurality of electrical sources comprises a direct-current (DC) voltage source that is coupled to an input gate of said MOSFET section wherein an input gate of said JFET is coupled to a source for said MOSFET section coupled to a common drain for said MOSFET section.

47. A method associated with an electrical system comprising:
providing an electrical system comprising a metal oxide semiconductor (MOS) field effect transistor (MOSFET) section formed with a control gate having a first side, a source region, a drain region, and a first semi-conductive channel region (SCR) formed with a first SCR side and an opposing second SCR side, wherein said first SCR is formed having opposing ends abutting and between said source region and said drain region, said first SCR's first side is formed facing and in proximity with said control gate first side on a first side of said MOSFET;
providing a junction field effect transistor (JFET) having a first side and comprising a first JFET gate contact region, a second JFET gate contact region, and a JFET semi-conductive channel region having an opposite semi-conductive function as said first SCR, wherein said JFET further defines a first JFET axis running between said first and second JFET gate contact regions, said JFET semi-conductive channel region is disposed overlapping a portion of and facing one side of said first and second JFET gate contact regions at opposing ends of said JFET semi-conductive channel region, wherein said JFET semi-conductive channel region is formed so that said JFET first axis is perpendicular to said MOSFET's SCR such that operation of the JFET modulates or controls current passing through said SCR that is, absent operation of said JFET, controlled by an electrical path of said MOSFET's SCR;
providing a control system for determining when said JFET and said MOSFET section are to be operated comprising an automated system including sensors as well as a control section, wherein said determining step can comprise detecting a source of radiation or electromagnetic interference operable to affect operation of said MOSFET section; and
providing a plurality of electrical sources coupled to said MOSFET section and said JFET section.

48. A method as in claim 47 further comprising operating said electrical system in one of a plurality of modes comprising a first, second, or third mode in response to a control input to adjust, modulate, or cut-off said current passing through a semi-conductive channel region.

49. A method as in claim 48, wherein said first mode comprises operating said MOSFET in a MOSFET cut-off mode to halt passage of said electrical signals through said MOSFET section; wherein said second mode comprises operating said MOSFET in a MOSFET linear mode to alter resistive characteristics of at least a portion of said MOSFET section; and wherein said third mode comprises operating said MOSFET in a MOSFET saturation mode to limit an amount of current that can pass through at least a portion of said MOSFET section.

50. A method as in claim 47, wherein said control systems can comprise a radio-frequency transmitter or receiver system.

51. A method as in claim 47, wherein said providing a plurality electrical sources comprises providing a plurality of alternating-current (AC) voltage sources each one coupled to said MOSFET section and said JFET section.

52. A method as in claim 47, further comprises providing a control system operable to modulate said plurality of alternating-current (AC) voltage sources to generate a radio-frequency response output from said MOSFET section and JFET section.

53. A method as in claim 47, wherein said providing a plurality of electrical sources comprises further comprising providing a plurality of direct-current (DC) voltage sources that are each coupled to an input gate of said MOSFET section and said JFET section.

54. An electrical system as in claim 47, wherein said providing a plurality electrical sources comprises further comprising providing a direct-current (DC) voltage source that is coupled to an input gate of said MOSFET section wherein an input gate of said JFET is coupled to a source for said MOSFET section coupled to a common drain for said MOSFET section.

55. A method as in claim 47, further comprising:
operating said JFET in response to said detecting said source of radiation or electromagnetic radiation to control passage of electrical signals through said MOSFET section to alter said MOSFET's response to said source.

56. A method associated with an electrical control system comprising:
providing a metal oxide semi-conductor (MOS) field effect transistor (MOSFET) section disposed in a first substrate section, said MOSFET section comprising a MOSFET control gate, a source region, a drain region, and a semi-conductive channel region within a gate insulator region, said semi-conductive channel region formed between said source region and said drain region, said MOSFET control gate is disposed in proximity with and partially overlapping one side of said source region and one side of said drain region, said MOSFET gate is further disposed on a first side of said semi-conductive channel region; and
providing a monolithic junction field effect transistor (JFET) section disposed on a second side of said gate insulator region that that faces away from said MOSFET control gate, said JFET section comprises an opposite dopant of said semi-conductive channel region, said JFET section is further formed comprising a doped region that is not in physical contact with either said source or said drain region and is positioned at a first distance from said MOSFET control gate, said first distance is determined based on a required distance that an electromagnetic field generated by said JFET must travel to pass through said semi-conductive channel region; wherein said JFET section is disposed perpendicularly to said MOSFET on one side of said MOSFET;
providing a control system for determining when said JFET and said MOSFET section are to be operated comprising an automated system including sensors as well as a control section, wherein said determining step can comprise detecting a source of radiation or electromagnetic interference operable to affect operation of said MOSFET section; and
providing a plurality of electrical sources coupled to said MOSFET section and said JFET section.

57. A method as in claim 56 further comprising operating said electrical system in one of a plurality of modes comprising a first, second, or third mode in response to a control input to adjust, modulate, or cut-off said current passing through a semi-conductive channel region.

58. A method as in claim 57, wherein said first mode comprises operating comprises operating said MOSFET in a MOSFET cut-off mode to halt passage of said electrical signals through said MOSFET section; wherein said second mode comprises operating said MOSFET in a MOSFET linear mode to alter resistive characteristics of at least a portion of said MOSFET section; and wherein said third mode comprises operating said MOSFET in a MOSFET saturation mode to limit an amount of current that can pass through at least a portion of said MOSFET section.

59. A method as in claim 56, wherein said control systems can comprise a radio-frequency transmitter or receiver system.

60. A method as in claim 56, wherein said providing a plurality electrical sources comprises providing a plurality of alternating-current (AC) voltage sources each one coupled to said MOSFET section and said JFET section.

61. A method as in claim 56, further comprises providing a control system operable to modulate said plurality of alternating-current (AC) voltage sources to generate a radio-frequency response output from said MOSFET section and JFET section.

62. A method as in claim 56, wherein said providing a plurality electrical sources comprises further comprising providing a plurality of direct-current (DC) voltage sources that are each coupled to an input gate of said MOSFET section and said JFET section.

63. An electrical system as in claim 56, wherein said providing a plurality electrical sources comprises further comprising providing a direct-current (DC) voltage source that is coupled to an input gate of said MOSFET section wherein an input gate of said JFET is coupled to a source for said MOSFET section coupled to a common drain for said MOSFET section.

64. A method as in claim 56, further comprising operating said JFET in response to said detecting said source of radiation or electromagnetic radiation to control passage of electrical signals through said MOSFET section to alter said MOSFET's response to said source.

65. An electrical system comprising:
a first and second transistor disposed within a substrate, wherein said first transistor comprises a first semi-conductive channel region (SCR) having a first dopant that has a first semi-conductive response mode, said second transistor comprises a second SCR having a second dopant that has a second semi-conductive response mode that is opposite of said first semi-conductive response mode, wherein said first and second transistors are formed respectively having a first and second axis defined by respective lines passing between gate contacts on either ends of said first and second transistors, wherein said first and second axis are perpendicular to each other, wherein said second transistor's second SCR is disposed so as to produce an electromagnetic field that passes into said first SCR when said second transistor has a first control electrical signal applied one of its gate contacts and is configured or operable to modulate current or voltage response of said first transistor; and
a control system and sensor system operable to detect when said first transistor is being subjected to electromagnetic interference that alters operation of said first SCR, said control system further configured to apply said first control electrical signal to alter operation of said first transistor during presence of said electromagnetic interference in said first SCR.

66. An electrical system as in claim 65, wherein said first transistor is a metal oxide semiconductor field effect transistor and said second transistor is a junction field effect transistor.

67. An electrical system as in claim 66, wherein said control system for determining when said JFET and said MOSFET sections are to be operated further comprises an automated system including sensors as well as a control section, wherein said automated system can include radiation sensors.

68. An electrical system as in claim 67, wherein said control systems can comprise a radio frequency transmitter or receiver system.

69. The electrical system as in claim 66, further comprising a plurality of alternating current (AC) voltage sources each one coupled to said MOSFET section and said JFET section.

70. An electrical system as in claim 66, further comprising a control system operable to modulate said plurality of alternating-current (AC) voltage sources to generate a radio-frequency response output from said MOSFET and JFET sections.

71. An electrical system as in claim 66, further comprising a plurality of direct-current (DC) voltage sources that are each coupled to an input gate of said MOSFET and JFET sections.

72. An electrical system as in claim 66, further comprising a direct-current (DC) voltage source that is coupled to an input gate of said MOSFET section wherein an input gate of said JFET is coupled to a source for said MOSFET section coupled to a common drain for said MOSFET section.

* * * * *